(12) United States Patent
    Huang et al.

(10) Patent No.: US 12,701,772 B2
(45) Date of Patent: Aug. 4, 2026

(54) SEMICONDUCTOR STRUCTURE WITH DIFFERENT DISTANCES BETWEEN GATES AND SOURCE CONTACTS, AND METHOD OF MANUFACTURING THE SAME

(71) Applicant: TAIWAN SEMICONDUCTOR MANUFACTURING COMPANY LTD., Hsinchu (TW)

(72) Inventors: Yu-Xuan Huang, Hsinchu (TW); Hou-Yu Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 672 days.

(21) Appl. No.: 18/153,362

(22) Filed: Jan. 12, 2023

(65) Prior Publication Data

US 2024/0087959 A1     Mar. 14, 2024

Related U.S. Application Data

(60) Provisional application No. 63/374,912, filed on Sep. 8, 2022.

(51) Int. Cl.
    *H10D 84/03*      (2025.01)
    *H10D 64/23*      (2025.01)
    (Continued)

(52) U.S. Cl.
    CPC ......... *H10D 84/038* (2025.01); *H10D 64/258* (2025.01); *H10D 84/0149* (2025.01); *H10D 84/83* (2025.01)

(58) Field of Classification Search
    CPC .............. H10D 84/038; H10D 64/258; H10D 84/0149; H10D 84/83; H10D 89/10; H10D 84/0135; H01L 21/0273–0279; H01L 21/312–3128; H01L 21/682; H01L 21/7681; H01L 21/76811;
    (Continued)

(56) References Cited

U.S. PATENT DOCUMENTS

| | | | |
|---|---|---|---|
| 6,282,113 B1 * | 8/2001 | DeBrosse | .............. G11C 5/063 365/69 |
| 7,625,790 B2 * | 12/2009 | Yang | .................... H10D 30/024 257/E21.001 |

(Continued)

*Primary Examiner* — Maliheh Malek
(74) *Attorney, Agent, or Firm* — WPAT LAW; Anthony King

(57)     ABSTRACT

A method for manufacturing a semiconductor structure is provided. A first layout is received, wherein the first layout comprises at least a pattern of an active region extending in a first direction. A second layout comprising a plurality of gate patterns extending in a second direction substantially perpendicular to the first direction is received, wherein distances between adjacent gate patterns are substantially consistent among the plurality of gate patterns. The first layout and the second layout are overlapped, thereby forming a plurality of transistor patterns. One of the plurality of gate patterns is shifted toward a source of one of the transistor patterns to form a third layout. A first photomask including the third layout is formed. The third layout of the photomask is transferred to form a plurality of gate structures over a substrate. A semiconductor structure thereof is also provided.

20 Claims, 27 Drawing Sheets

(51) Int. Cl.
  *H10D 84/01* (2026.01)
  *H10D 84/83* (2025.01)

(58) Field of Classification Search
  CPC ......... H01L 21/027–0338; H01L 21/32; H01L 21/0271–0279; H01L 21/033–0338; H01L 21/314–3185
  See application file for complete search history.

(56) References Cited

U.S. PATENT DOCUMENTS

| | | | | |
|---|---|---|---|---|
| 9,305,785 | B2 * | 4/2016 | Wei ..................... | H10D 64/013 |
| 9,449,970 | B2 * | 9/2016 | Do ..................... | H10D 84/907 |
| 9,553,093 | B1 * | 1/2017 | Seo ..................... | H10D 84/853 |
| 9,754,936 | B2 * | 9/2017 | Park ..................... | H10D 84/83 |
| 10,109,347 | B2 * | 10/2018 | Liu ..................... | G11C 5/063 |
| 11,404,443 | B2 * | 8/2022 | Song ..................... | G06F 30/398 |
| 11,862,623 | B2 * | 1/2024 | Young ..................... | H10D 89/10 |
| 2008/0123388 | A1 * | 5/2008 | Scott ..................... | H10D 89/10 257/E27.102 |
| 2008/0144347 | A1 * | 6/2008 | Takemura ..................... | G11C 13/0004 365/63 |
| 2008/0203586 | A1 * | 8/2008 | Bach ..................... | H10D 89/10 257/786 |
| 2010/0096669 | A1 * | 4/2010 | Popp ..................... | H10B 12/482 257/300 |
| 2010/0097835 | A1 * | 4/2010 | Popp ..................... | G11C 5/063 365/63 |
| 2010/0190096 | A1 * | 7/2010 | Ausschnitt ..................... | G03F 7/70683 430/30 |
| 2011/0299328 | A1 * | 12/2011 | Liu ..................... | G01R 33/1284 365/163 |
| 2013/0260516 | A1 * | 10/2013 | Chang ..................... | H10D 84/0135 438/286 |
| 2014/0327080 | A1 * | 11/2014 | Hung ..................... | H10D 30/0212 257/365 |
| 2015/0380250 | A1 * | 12/2015 | Wei ..................... | H10D 64/013 438/424 |
| 2016/0307837 | A1 * | 10/2016 | Park ..................... | H10D 84/83 |
| 2017/0263506 | A1 * | 9/2017 | Bouche ..................... | H10D 84/0186 |
| 2017/0323889 | A1 * | 11/2017 | Song ..................... | H10D 84/859 |
| 2018/0061664 | A1 * | 3/2018 | Saito ..................... | H10P 30/22 |
| 2020/0075428 | A1 * | 3/2020 | Venigalla ..................... | H10D 84/0128 |
| 2020/0104460 | A1 * | 4/2020 | Peng ..................... | G06F 30/398 |
| 2020/0126841 | A1 * | 4/2020 | Dai ..................... | H10W 20/063 |
| 2020/0381433 | A1 * | 12/2020 | Cai ..................... | H10D 84/0172 |
| 2021/0273105 | A1 * | 9/2021 | Song ..................... | B82Y 10/00 |
| 2021/0343695 | A1 * | 11/2021 | Chiu ..................... | H10D 89/10 |
| 2022/0359557 | A1 * | 11/2022 | Ryu ..................... | H10B 43/50 |
| 2023/0039141 | A1 * | 2/2023 | Ren ..................... | H10D 30/668 |
| 2023/0223074 | A1 * | 7/2023 | Yang ..................... | G11C 11/4097 365/63 |
| 2023/0320057 | A1 * | 10/2023 | Ong ..................... | H10B 10/12 |
| 2024/0038755 | A1 * | 2/2024 | Hu ..................... | H10D 84/853 |
| 2024/0332020 | A1 * | 10/2024 | Hsieh ..................... | H10P 76/204 |
| 2024/0421145 | A1 * | 12/2024 | Radens ..................... | H10D 89/10 |
| 2025/0192036 | A1 * | 6/2025 | Lee ..................... | H10W 20/42 |

* cited by examiner

205

515'

125'

514'

124'

513'

123'

512a'

122'

512b'

511'

121'

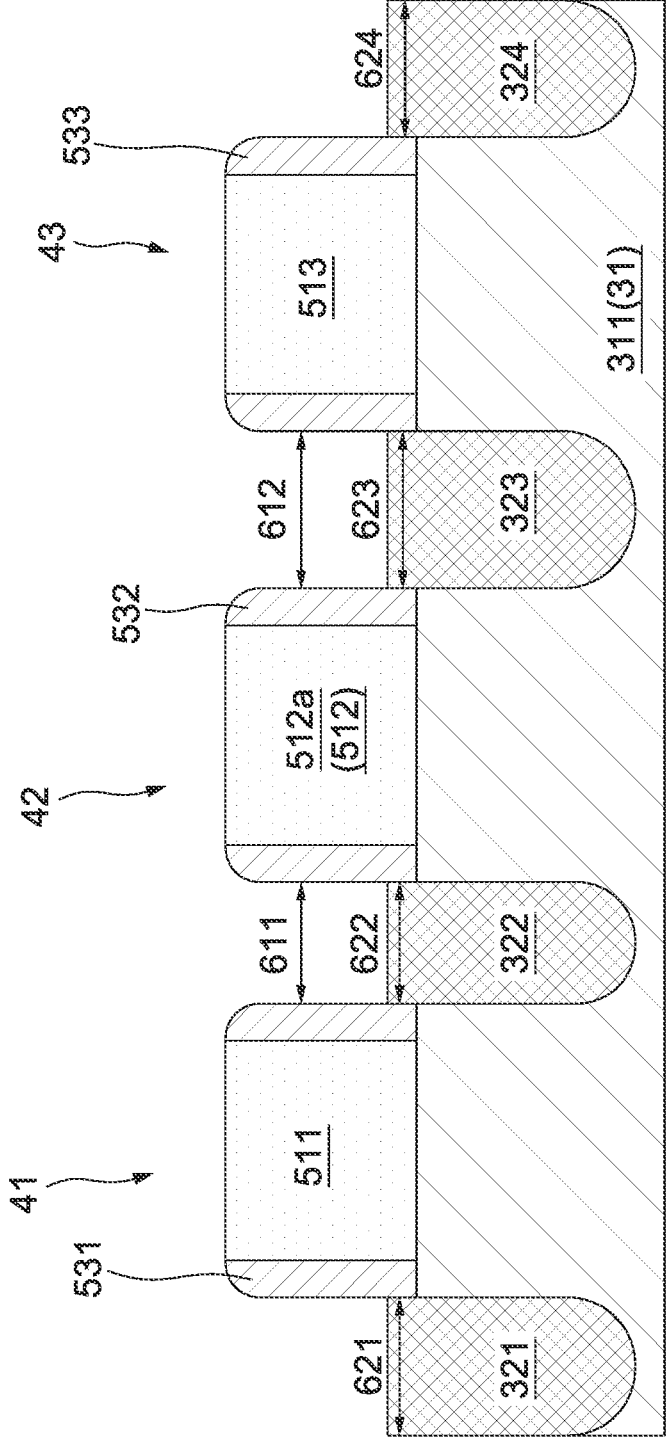
FIG. 16
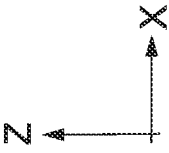

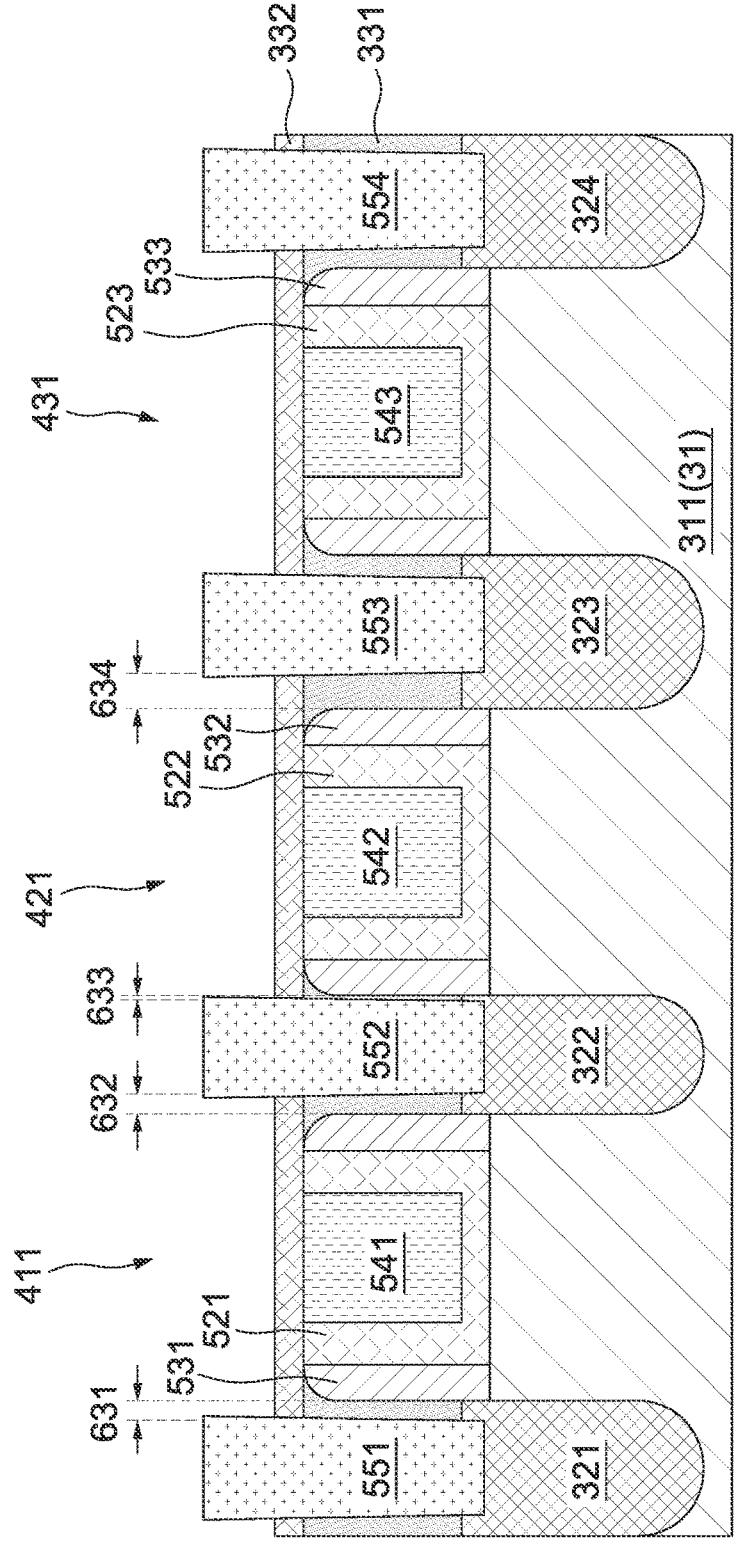
FIG. 22
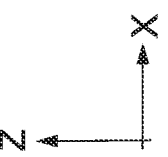

205

51'

121'  122'  123'

700

701 — Receiving a first layout, comprising at least a pattern of an active region extending along a first direction 702 — Receiving a second layout comprising a plurality of gate pattern extending along a second direction substantially perpendicular to the first direction, wherein distances between adjacent gate patterns are substantially consistent among the plurality of gate patterns 703 — Overlapping the first layout and the second layout thereby forming a plurality of transistor patterns 704 — Shifting one of the plurality of gate patterns toward a source of one of the transistor patterns to form a third layout 705 — Forming a first photomask including the third layout 706 — Transferring the third layout of the photomask to form a plurality of gate structures over a substrate

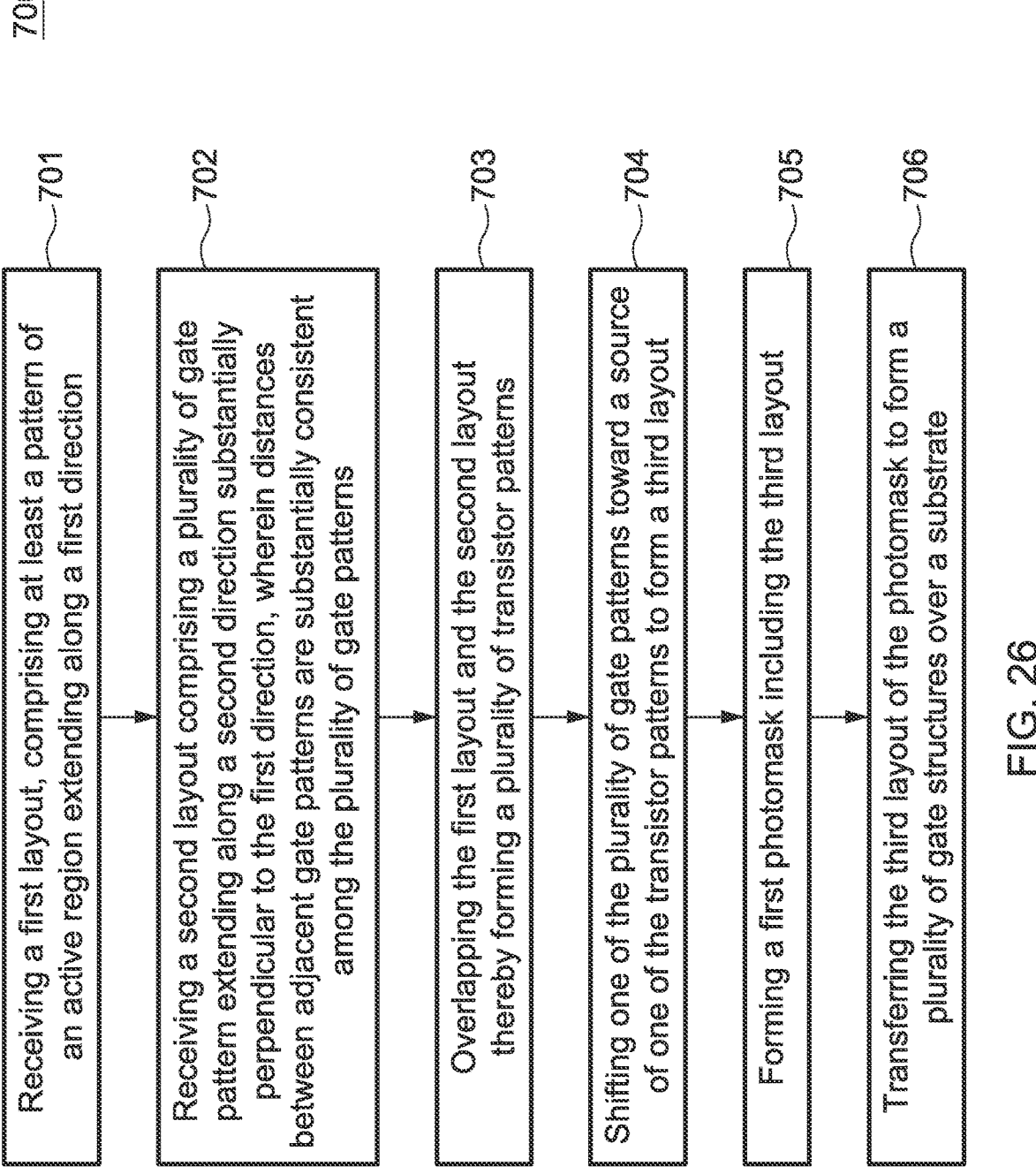

FIG. 26

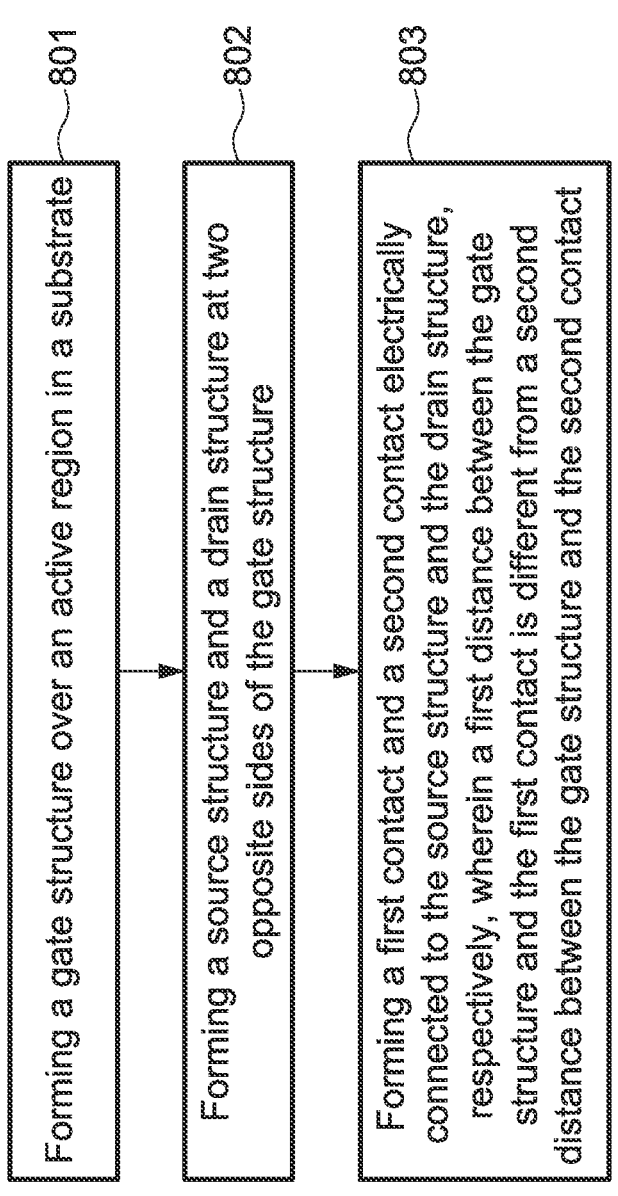

800

801 Forming a gate structure over an active region in a substrate

802 Forming a source structure and a drain structure at two opposite sides of the gate structure 803 Forming a first contact and a second contact electrically connected to the source structure and the drain structure, respectively, wherein a first distance between the gate structure and the first contact is different from a second distance between the gate structure and the second contact

FIG. 27

SEMICONDUCTOR STRUCTURE WITH DIFFERENT DISTANCES BETWEEN GATES AND SOURCE CONTACTS, AND METHOD OF MANUFACTURING THE SAME

PRIORITY CLAIM AND CROSS-REFERENCE

This application claims the benefit of prior-filed provisional application No. 63/374,912, filed on 8 Sep. 2022.

BACKGROUND

Semiconductor devices are used in a variety of electronic applications, such as personal computers, cellular phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, issues of greater parasitic capacitance have arisen.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, dimensions of the various features may be arbitrarily increased or reduced for clarity of discussion.

FIG. 16 is a schematic cross-sectional diagram of a semiconductor structure at a stage of a manufacturing method in accordance with different embodiments of the disclosure.

FIGS. 19 to 22 are schematic cross-sectional diagrams of a semiconductor structure at different stages of a manufacturing method in accordance with different embodiments of the disclosure.

FIG. 26 is a flow diagram of a method of manufacturing a semiconductor structure in accordance with some embodiments of the disclosure.

FIG. 27 is a flow diagram of a method of manufacturing a semiconductor structure in accordance with some embodiments of the disclosure.

DETAILED DESCRIPTION

Figure 1:
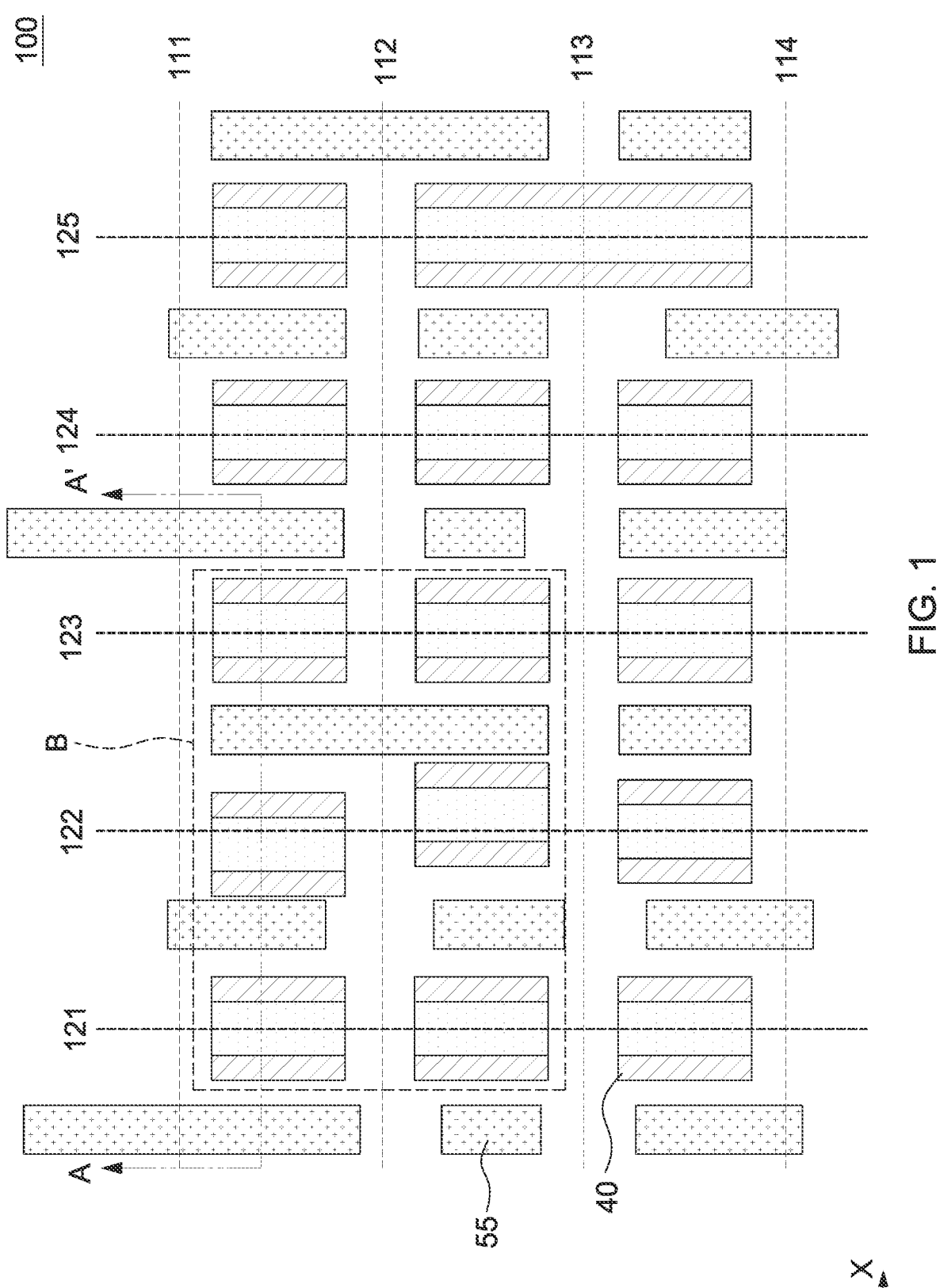
FIG. 1 is a schematic top-view diagram of a semiconductor structure in accordance with some embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context. In addition, the term "source/drain region" or "source/drain regions" may refer to a source or a drain, individually or collectively dependent upon the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from normal deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic top view of a semiconductor structure 100 in accordance with some embodiments of the present disclosure. The semiconductor structure 100 includes a plurality of gate structures 40 and a plurality of contact structures 55 alternately arranged with the plurality of gate structures 40. In some embodiments, widths of the gate structures 40 are substantially equal, wherein the widths are measured along a first direction (e.g., X direction). In some embodiments, widths of the contact structures 55 are substantially equal, wherein the widths are measured along the first direction. The gate structures 40 are grouped into multiple columns extending along a second direction (e.g., Y direction), substantially orthogonal to the first direction. The semiconductor structure 100 may include multiple cells, the cells may be grouped or arranged into multiple rows. For instance, lines 111, 112, 113 and 114 shown in FIG. 1 are depicted in FIG. 1 indicating multiple cell rows arranged along the second direction and extending along the first direction, wherein each of the cell rows is disposed between two adjacent lines 111, 112, 113 and 114. Each of the cell rows may include one or multiple cells, and a number of cells in a cell row depends on different applications. In some embodiments, the gate structures 40 arranged in one column disposed in different cell rows are separated by a default distance. In some embodiments, at least one of the gate structures 40 extends across adjacent cell rows. It should be noted that the lines 111, 112, 113 and 114 are for a purpose of illustration and indication of different cell rows arranged along the second direction, but are not intended to indicate a specific element formed in the semiconductor structure 100. Similarly, for a purpose of illustration, lines 121, 122, 123, 124 and 125 are shown in FIG. 1 for a purpose of representing central lines of the columns of the gate structures 40. The semiconductor structure 100 includes at least one of the gate structures 40 offset from the corresponding central line(s).

Figure 2:
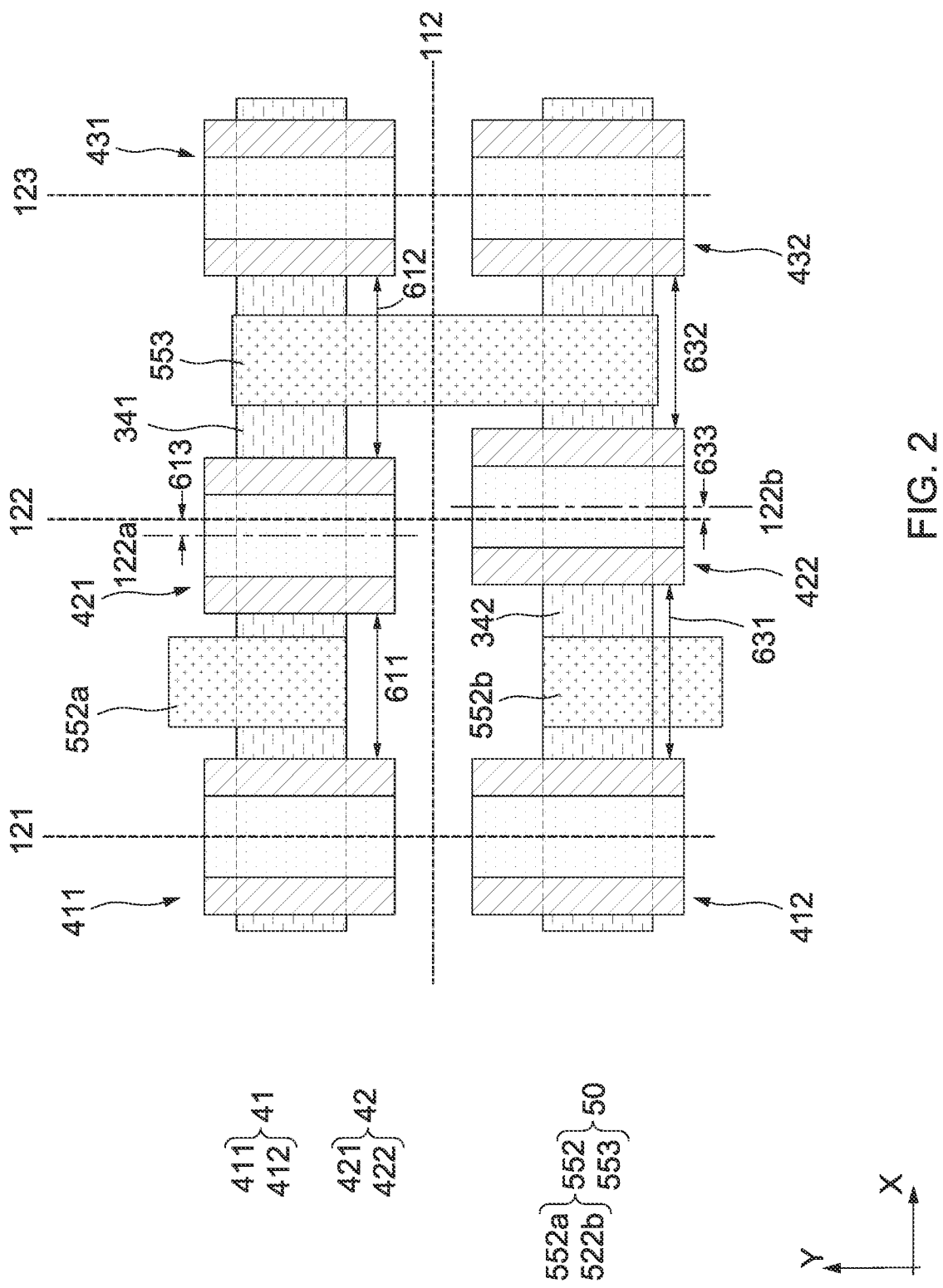
FIG. 2 is an enlarged schematic top-view diagram of a portion B of the semiconductor structure in FIG. 1 in accordance with some embodiments of the disclosure.

FIG. 2 is an enlarged schematic top view of a region B of the semiconductor structure 100 shown in FIG. 1 in accordance with some embodiments of the present disclosure. In some embodiments, the plurality of gate structures 40 include gate structures 411, 421 and 431 and gate structures 412, 422 and 432, wherein the gate structures 411, 421 and 431 are arranged along the first direction and in different columns, and the gate structures 412, 422 and 432 are arranged along the first direction and in different columns. In some embodiments, the gate structures 411 and 412 are arranged in one column, the gate structures 421 and 422 are arranged in one column, and the gate structures 431 and 432 are arranged in one column. In some embodiments, the gate structures 411, 421 and 431 are disposed over an active region 341 of the semiconductor structure 100, and the gate structures 412, 422 and 432 are disposed over an active region 342 of the semiconductor structure 100, wherein the active regions 341 and 342 are substantially parallel. In some embodiments, the gate structures 411, 421 and 431 are in a same cell unit, and the gate structures 412, 422 and 432 are in another cell unit.

The gate structures 40 in a column may be all aligned, or some of the gate structures 40 in the column may be shifted or offset. In some embodiments, central lines of the gate structures 411 and 412 overlap the line 121. In some embodiments, central lines of the gate structures 431 and 432 overlap the line 123. In some embodiments, a central line 122a of the gate structure 421 is shifted from the line 122. In some embodiments, a central line 122b of the gate structure 422 is shifted from the central line 122. In addition, the shifted gate structures 40 may have different amounts and/or directions of offset from the corresponding lines 121, 122, 123, 124 and 125. In some embodiments, the central line 122a of the gate structure 421 is shifted to a first side (e.g., left side) of the line 122. In some embodiments, a distance 613 between the central line 122a and the line 122 is in a range of 1 to 3 nanometers (nm). In some embodiments, the central line 122b of the gate structure 422 is shifted to a second side (e.g., right side), opposite to the first side, of the line 122. In some embodiments, a distance 633 between the central line 122b and the line 122 is in a range of 1 to 3 nm.

Distances between two adjacent lines 121, 122, 123, 124 and 125 are designed to be substantially equal, and thus adjacent gate structures 40 along the first direction can be different due to the differing amounts of offset of such gate structures 40. In some embodiments, distances between two adjacent lines 121, 122, 123, 124 and 125 are about 50 nm. In some embodiments, a distance 611 between the gate structures 411 and 421 is less than a distance 612 between the gate structures 421 and 431. In some embodiments, a difference between the distance 611 and the distance 612 is in a range of 2 to 6 nm. In some embodiments, a distance 631 between the gate structures 412 and 422 is greater than a distance 632 between the gate structures 421 and 431. In some embodiments, a difference between the distance 631 and the distance 632 is in a range of 2 to 6 nm. In some embodiments, the distance 611 is less than the distance 631, and the distance 612 is greater than the distance 632.

Referring back to FIGS. 1 and 2, the contact structures 55 are disposed alternately between the gate structures 40. In some embodiments, distances between adjacent contact structures 55 are substantially equal. Distances between a contact structure 55 and two adjacent gate structures can be same or different. For instance, distances between each of contact structures 552a, 552b, and 553 and its adjacent gate structures are different as shown in FIGS. 1 and 2.

Figure 3:
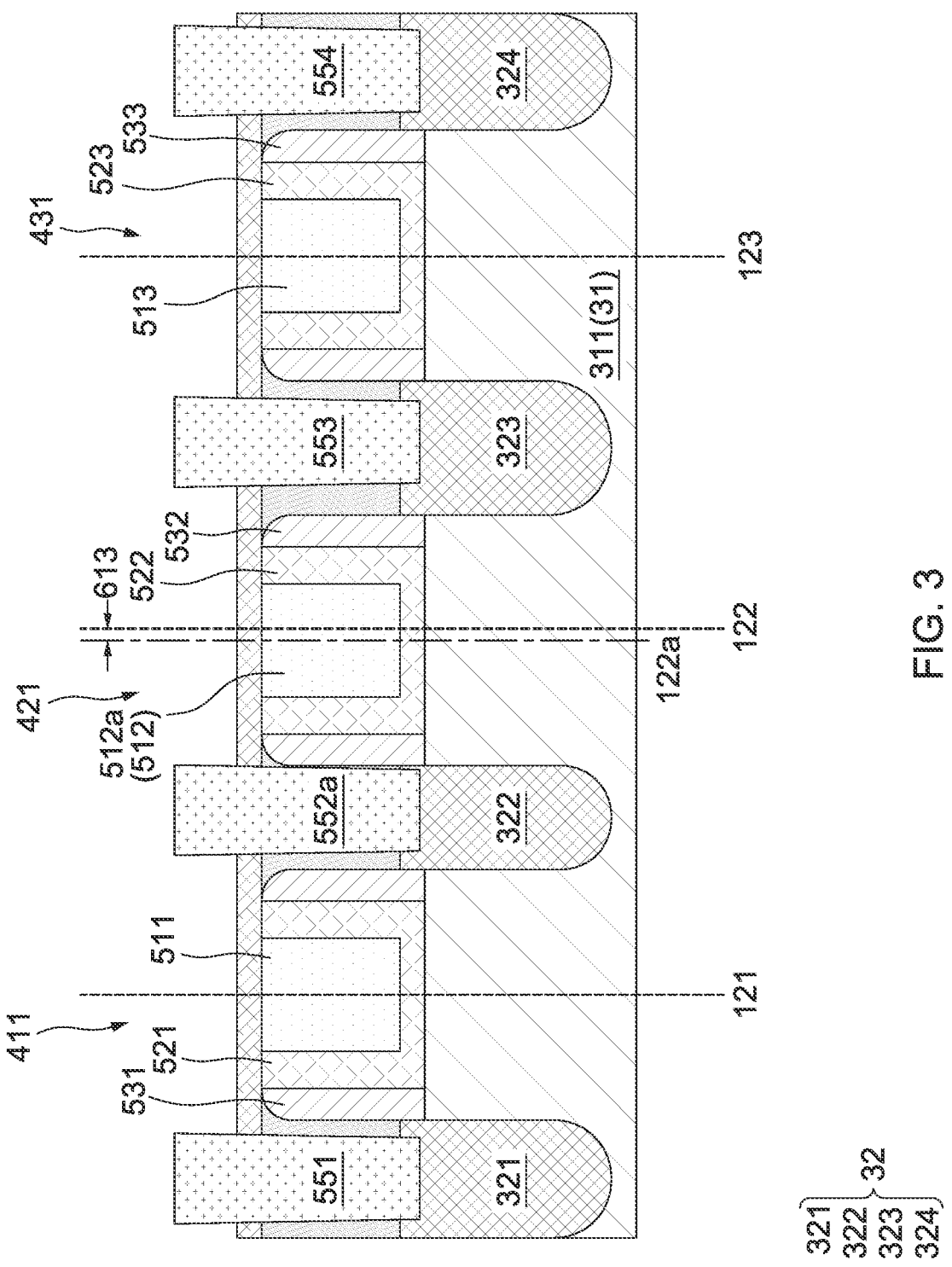
FIG. 3 is a schematic cross-sectional diagram of the semiconductor structure along a line A-A' in FIG. 1 in accordance with different embodiments of the disclosure.

FIG. 3 is a schematic cross-sectional diagram of the semiconductor structure 100 along a line A-A' shown in FIG. 1 in accordance with some embodiments. The semiconductor structure 100 may further include a plurality of source/drain structures 32 (including source/drain structures 321, 322, 323 and 324, for instance). Due to a manufacturing method of the semiconductor structure 100 (a detailed description of the manufacturing method is provided in the following paragraphs), an offset of a gate structure 40 may affect a size or a dimension of corresponding source/drain structures 32 disposed adjacent thereto. In some embodiments as shown in FIG. 3, a width or a size of the source/drain structure 322 is less than that of the source/drain structure 323. In some embodiments, the source/drain structures 322 and 323 and the gate structure 421 together define a transistor, and the source/drain structures 322 and 323 function as a source and a drain respectively of the transistor. In some embodiments, the width or the size of the source/drain structure 322 is less than that of the source/drain structure 321 or that of the source/drain structure 324.

A method of manufacturing a semiconductor structure including at least one shifted gate structure is also provided in the disclosure. In order to further illustrate concepts of the present disclosure, various embodiments are provided below. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to have different combinations of embodiments as long as the parameters or conditions used are not conflicted.

Figure 4:
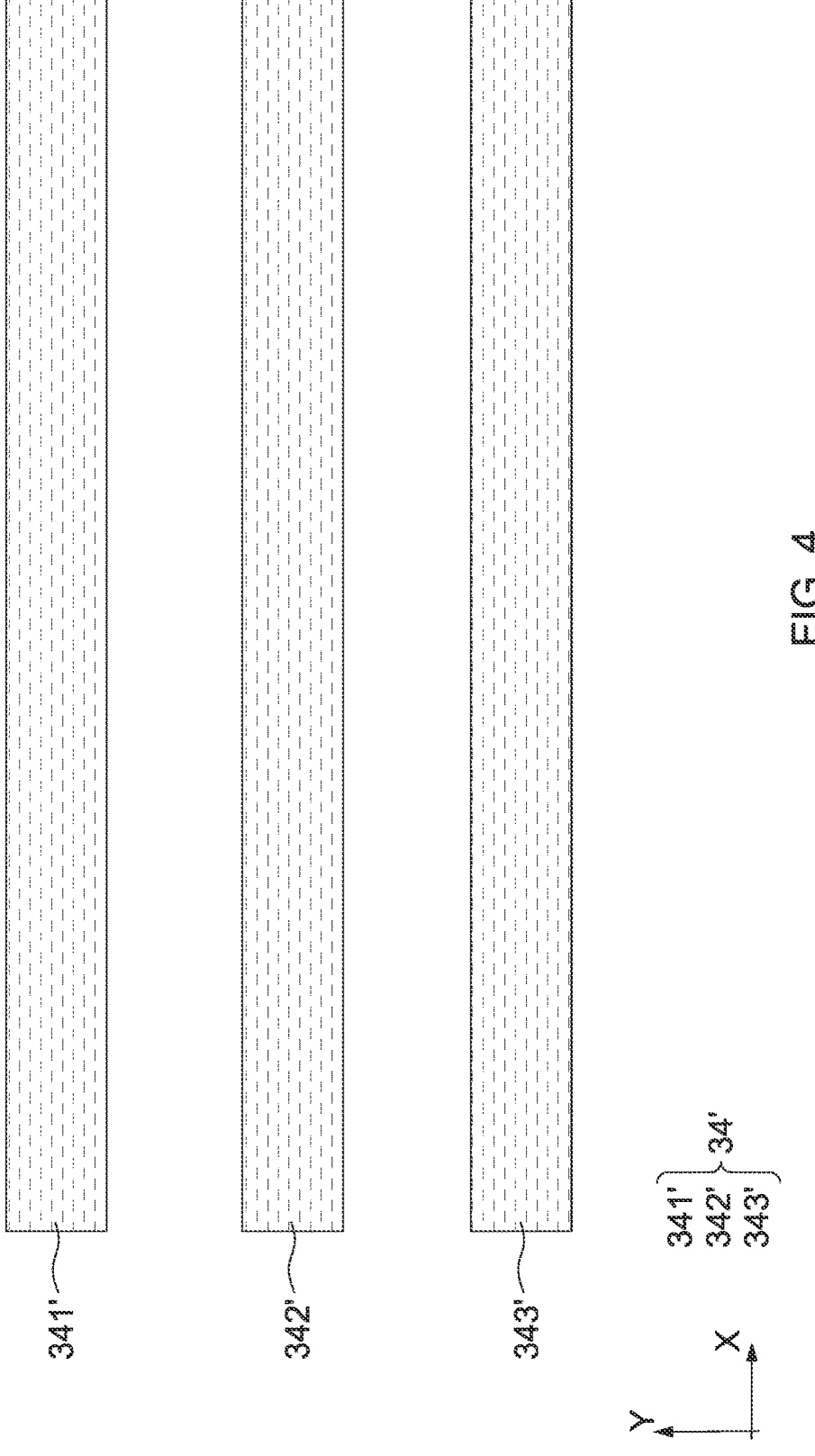
FIGS. 4 to 11 are schematic diagrams of different layouts and a combination of different layouts at different stages of a manufacturing method in accordance with different embodiments of the disclosure.

FIG. 4 is a schematic diagram of a first layout 201 showing patterns of active regions in a substrate of a semiconductor structure to be formed in subsequent processing. In some embodiments, the method includes a step of receiving or providing the first layout 201. The first layout 201 may include multiple patterns of active regions extending along a first direction (e.g., X direction). The multiple patterns 34' of the active regions may include a first pattern 341', a second pattern 342', and a third pattern 343' substantially parallel to one another.

Figure 5:
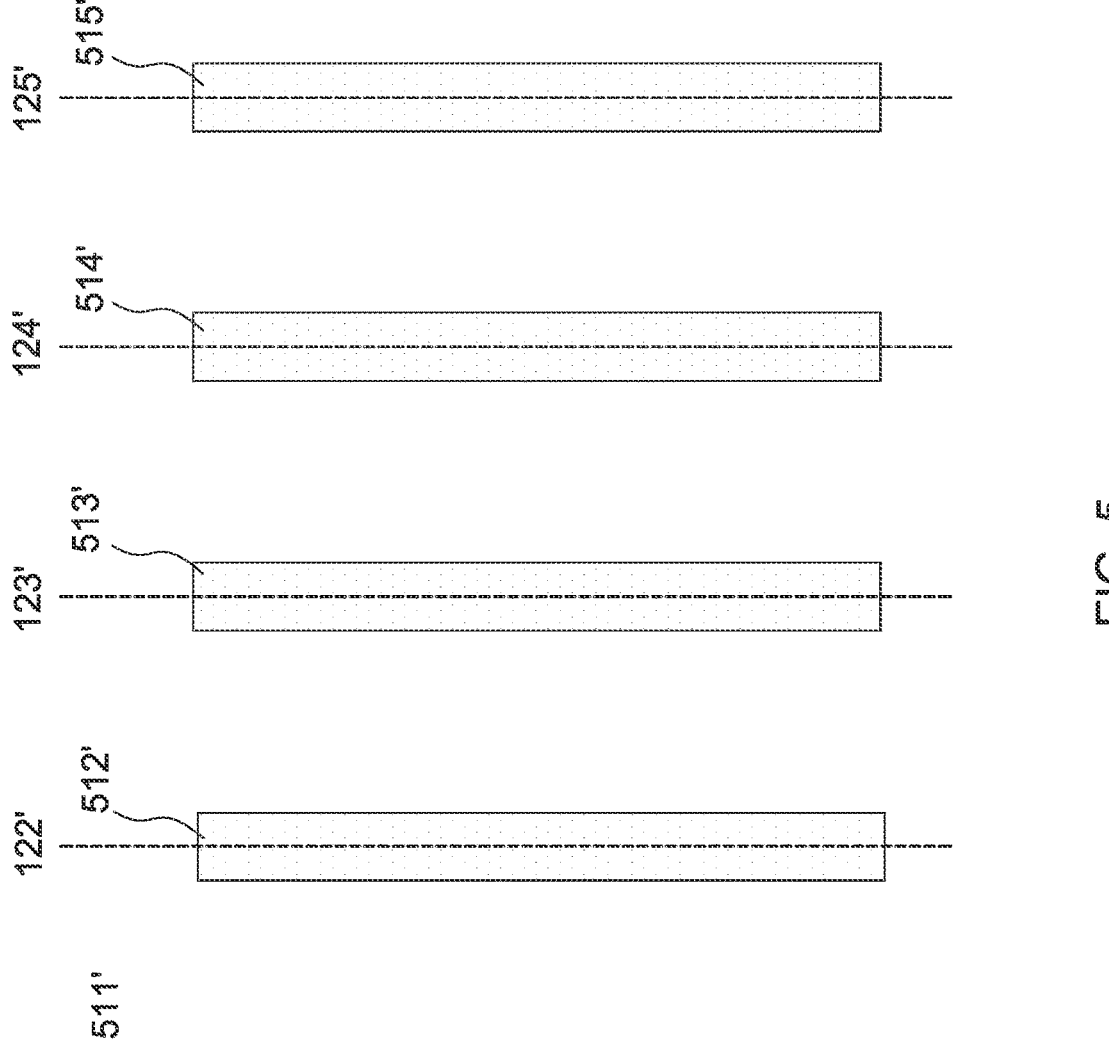
Figure 5:
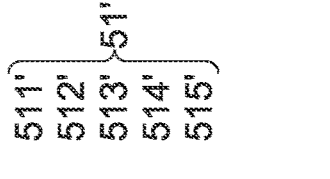
Figure 5:
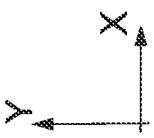

FIG. 5 is a schematic diagram of a second layout 202 showing patterns of gate structures of the semiconductor structure. In some embodiments, the method includes a step of receiving or providing the second layout 202. The second layout 202 may include a plurality of gate patterns 51' extending along a second direction (e.g., Y direction), substantially perpendicular to the first direction. The plurality of gate patterns 51' may include gate patterns 511', 512', 513', 514' and 515', wherein the gate patterns 511', 512', 513', 514' and 515' are substantially parallel to one another. For a purpose of illustration, multiple dashed lines 121', 122', 123', 124' and 125' are depicted in FIG. 5 to show central lines of the gate patterns 511', 512', 513', 514' and 515', respectively. In some embodiments, distances between adjacent pairs of the lines 121', 122', 123', 124' and 125' are substantially consistent. In some embodiments, distances between adjacent pairs of the gate patterns 511', 512', 513', 514' and 515' are substantially consistent.

Figure 6:
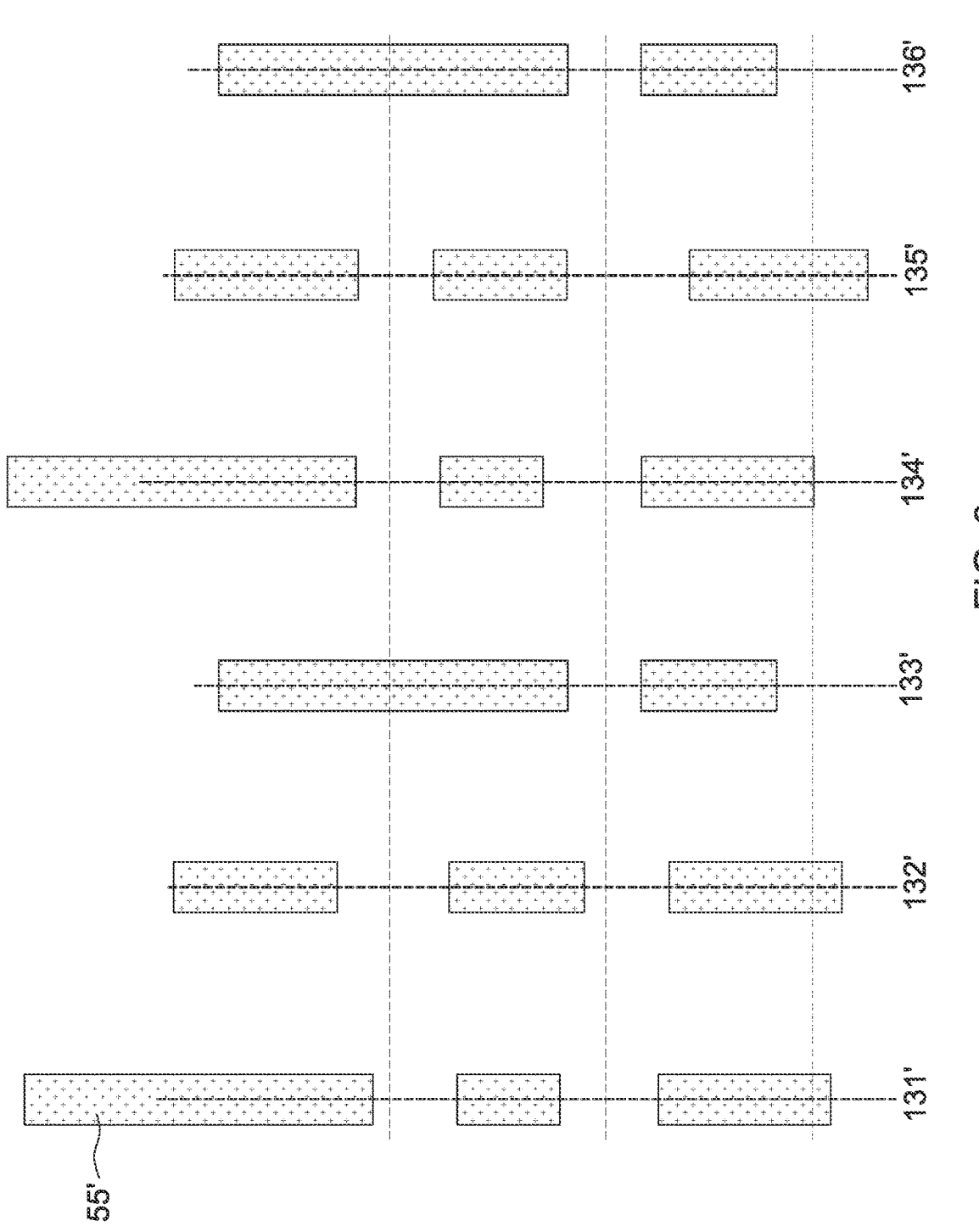

FIG. 6 is a schematic diagram of a third layout 203 showing patterns of contacts of the semiconductor structure. In some embodiments, the method includes a step of receiving or providing the third layout 203. The third layout 203 may include multiple contact patterns 55' extending along the second direction. The multiple contact patterns 55' may be arranged in multiple columns, wherein the contact patterns in a same column are arranged to be aligned along the second direction. For a purpose of illustration, multiple lines 131', 132', 133', 134', 135' and 136' are depicted in FIG. 6 to show central lines of different columns of the contact patterns 55'.

Figure 7:
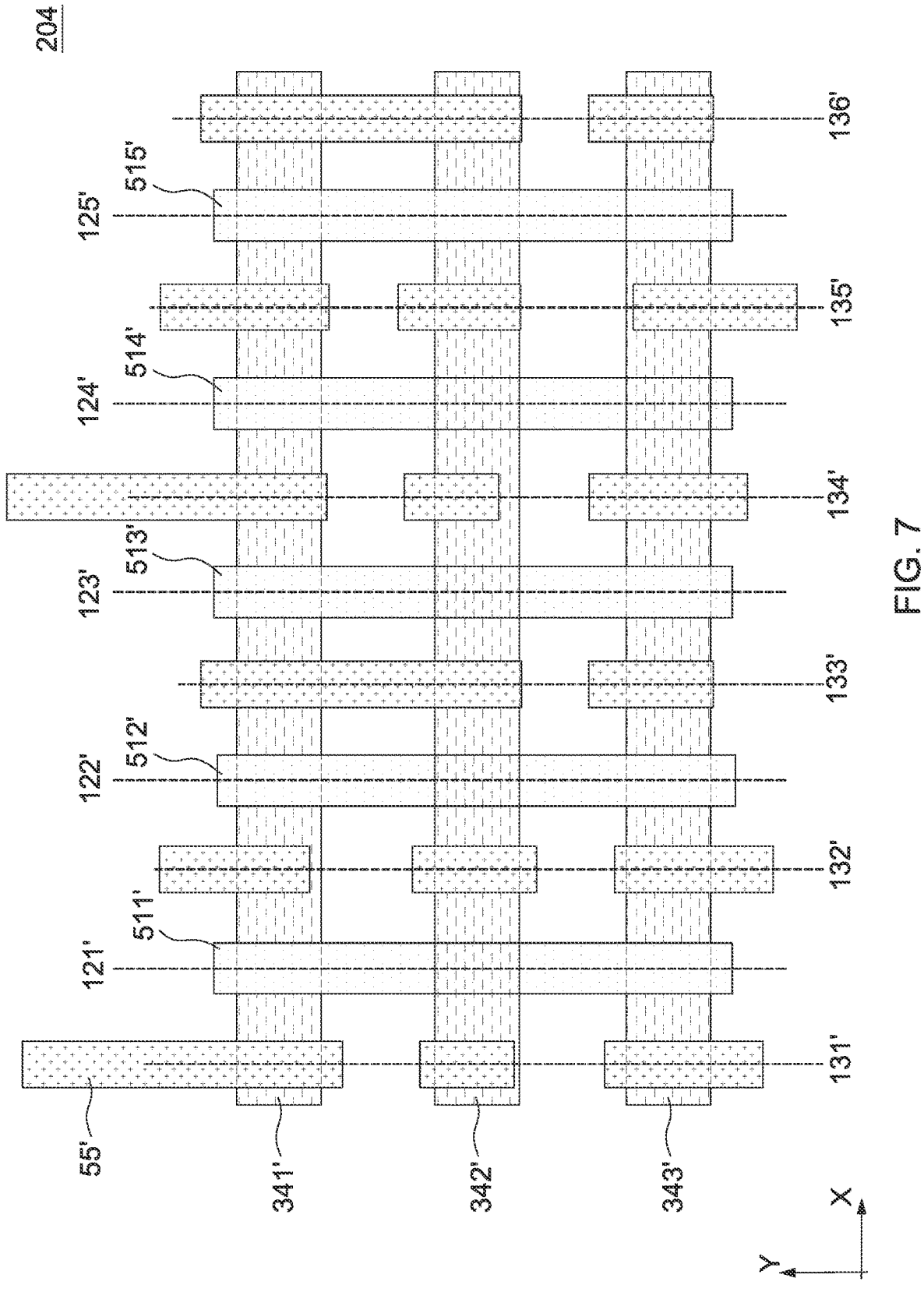

FIG. 7 is a schematic diagram showing a combined layout 204 of the first layout 201, the second layout 202 and the third layout 203. In some embodiments, after the first layout 201, the second layout 202 and the third layout 203 are received, the method further includes a step of overlapping the first layout 201, the second layout 202 and the third layout 203 to obtain the combined layout 204 as shown in FIG. 7.

Figure 8:
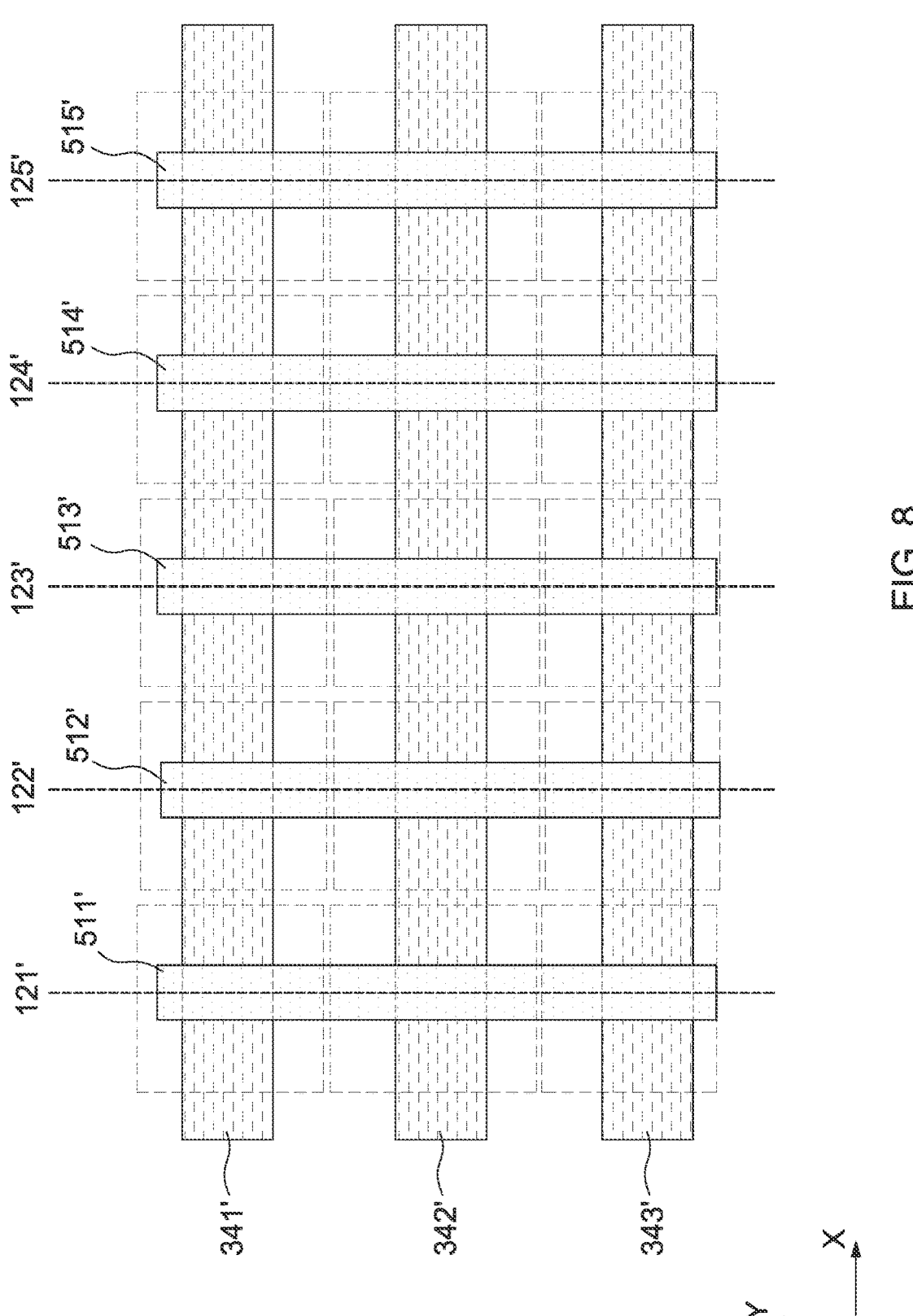

FIG. 8 is a schematic diagram showing a plurality of transistor patterns 70' in the combined layout 204. For simplicity of the diagram and ease of understanding, the multiple contact patterns 55' are omitted in FIG. 8. The plurality of transistor patterns 70' can be defined or formed in the combined layout 204. For instance, a portion of the gate pattern 511' and portions of the pattern 341' at two opposite sides of the gate pattern 511' can define a transistor pattern. It is known that a transistor includes a gate structure and a pair of source/drain structures, and a person in the art can understand how to define the transistor patterns 70' from the combined layout 204. In some embodiments, each of the transistor patterns 70' includes a source region and a drain region disposed at two opposite sides of its gate pattern in a corresponding pattern of the active region. It should be noted that each of the gate patterns 511', 512', 513', 514' and 515' can include multiple gate patterns of different transistor patterns.

Figure 9:
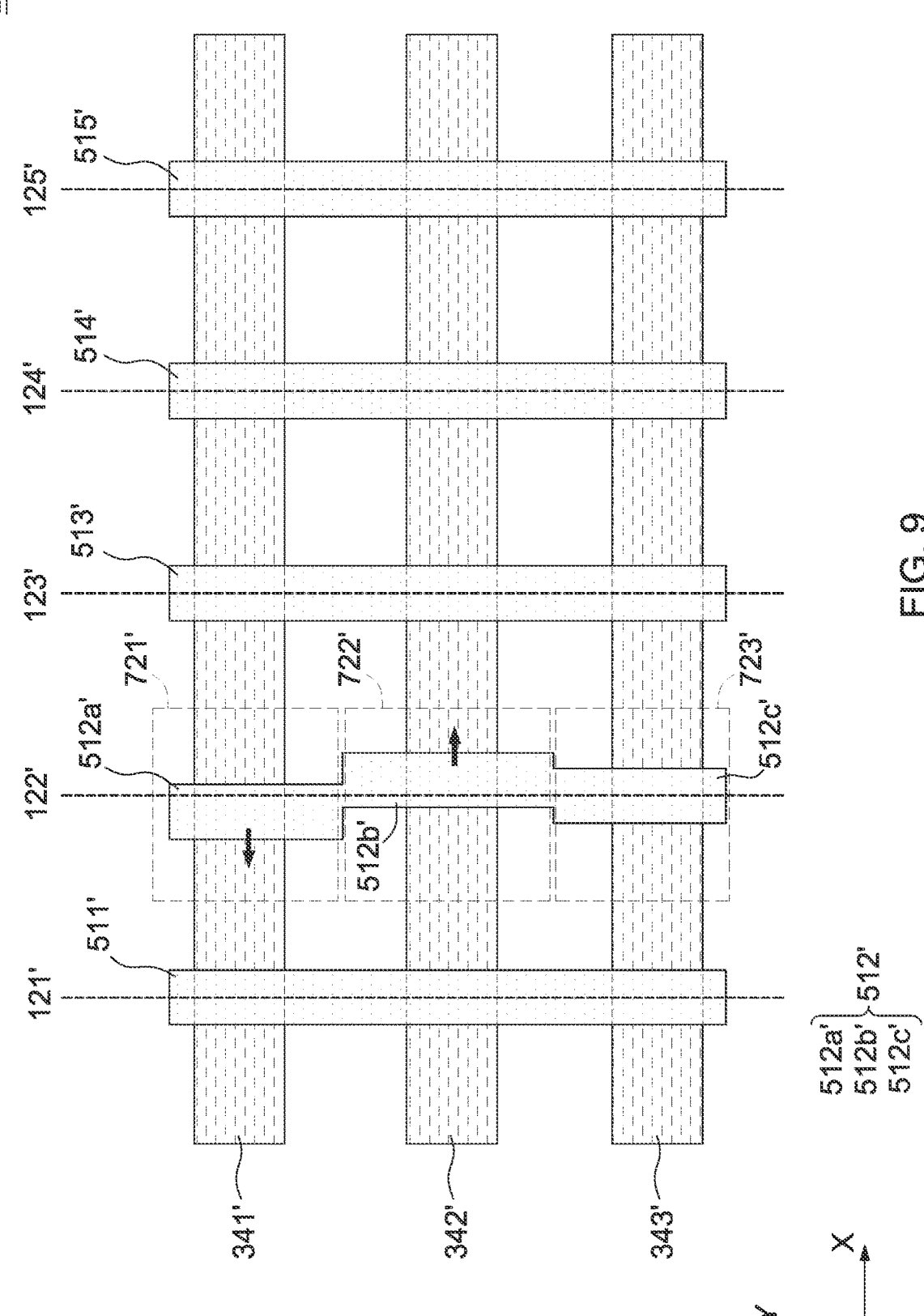
Figure 10:
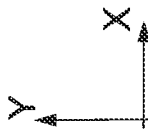

FIG. 9 is a schematic diagram showing the layout 204 at a stage of the method in accordance with some embodiments of the present disclosure. In some embodiments, the method further includes a step of shifting at least one of the gate patterns (e.g., 511', 512', 513', 514' or 515') of the layout 202 toward a source region of one of the transistor patterns. At least one or at least a portion of the gate patterns 511', 512', 513', 514' and 515' of the layout 202 is shifted based on a calculation of a total capacitance of a transistor pattern to form a layout 205. A layout 205 including the shifted gate patterns shown in FIG. 10 is thereby formed from the layout 202.

Contacts (e.g., 551, 552a, 553, and 554 shown in FIG. 3) and gate structures (e.g., 411, 421 and 431 shown in FIG. 3) of a transistor are formed according to the layouts 202 and 203, and capacitances between the contacts and the gate structures can be calculated based on the layouts 202 and 203. In some embodiments, source regions and drain regions of the transistor patterns are defined, and capacitances between gate structures and contact structures to be formed according to the layouts 202 and 203 are calculated prior to the shifting of the gate pattern.

Capacitances can be generated between a source contact and a gate structure and between a drain contact and a gate structure of a transistor during operation. However, the capacitance generated by the drain contact and the gate structure (the capacitance is referred to as $C_{gd}$ in the following paragraphs for ease of description) has a greater influence on a total capacitance of the transistor compared to the capacitance generated by the source structure and the gate structure (the capacitance is referred to as $C_{gs}$ in the following paragraphs for ease of description) due to a Miller effect. In order to achieve a lower total capacitance of a semiconductor structure, at least one gate pattern of a corresponding transistor pattern is shifted toward a source region of the corresponding transistor pattern.

Referring back to FIG. 9, the transistor patterns 70' include a transistor pattern 721' and a transistor pattern 722' arranged along the second direction. In some embodiments, a gate pattern 512a' (being a portion of the gate pattern 512') is shifted left toward a source region of the transistor pattern 721', wherein a shift direction of the gate pattern 512a' is indicated by an arrow. In some embodiments, a gate pattern 512b' (being a portion of the gate pattern 512' connected to the gate pattern 512a' along the second direction) is shifted right toward a source region of the transistor pattern 722', wherein a shift direction of the gate pattern 512b' is indicated by an arrow. In some embodiments, a gate pattern 512c' (being a portion of the gate pattern 512' connected to the gate pattern 512c' along the second direction) is not shifted based on the calculation of the total capacitance of the transistor 723'.

Figure 11:
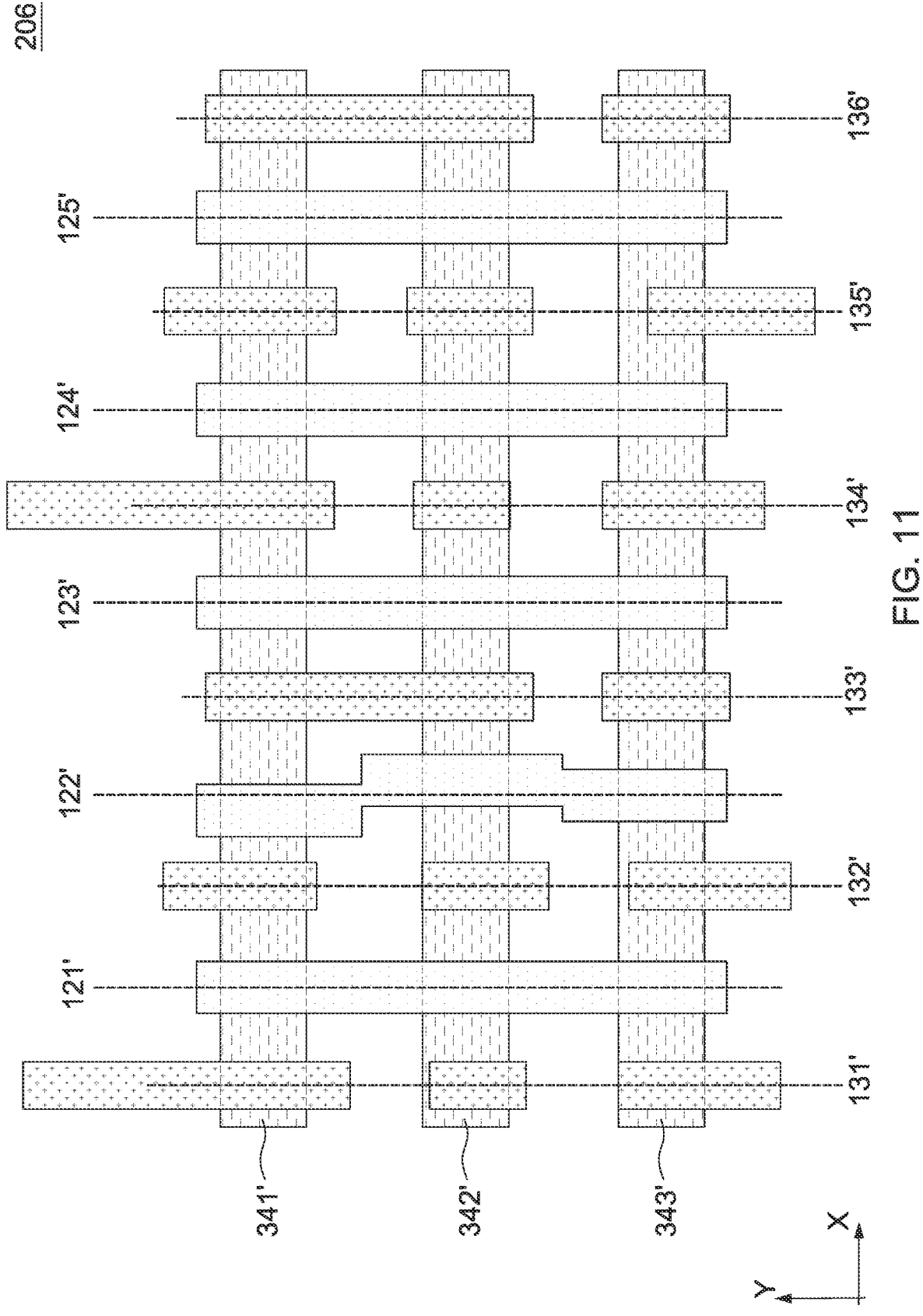

FIG. 11 is a schematic diagram showing the result layout 206 in accordance with some embodiments of the present disclosure. In some embodiments, the result layout 206 is a combination of the layouts 201, 205 and 203. In some embodiments, the method further includes a step of forming a first photomask including the layout 201. In some embodiments, the method further includes a step of forming a second photomask including the layout 205. In some embodiments, the method further includes a step of forming a third photomask including the layout 203. In some embodiments, the method further includes a step of forming a first photomask including the layout 201. The first photomask, the second photomask and the third photomask may be transferred at different stages of the method to form a plurality of active regions, a plurality of gate structures and a plurality of contact structures, respectively.

It should be noted that the calculation of the total capacitance can be performed at any stage of the method prior to the formations of the second photomask. In some embodiments, the calculation can be performed according to a data library stored in a processor. In alternative embodiments, the method includes collecting data of the contacts from the data library instead of overlapping the layouts as illustrated above.

FIGS. 12 to 23 are schematic diagrams of different perspectives of the semiconductor structure 100 at different stages of the method in accordance with some embodiments of the present disclosure.

Figure 12:
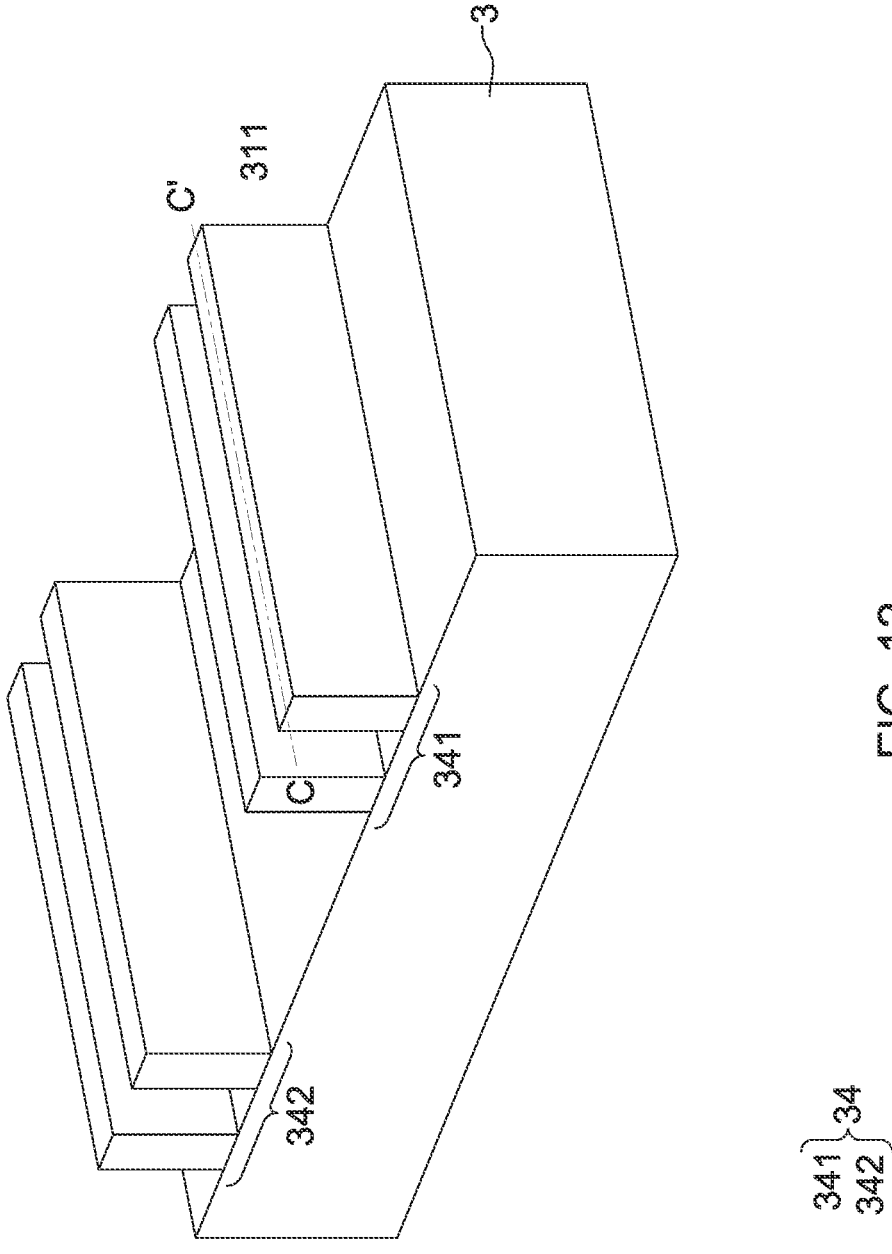
FIG. 12 is a schematic 3D diagram of a semiconductor structure at a stage of a manufacturing method in accordance with different embodiments of the disclosure.
Figure 12:
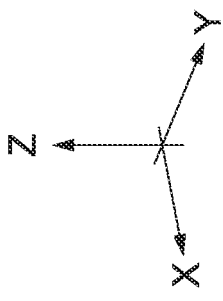

Please refer to FIG. 12, which is a schematic three-dimensional (3D) diagram of the semiconductor structure 100 at a stage of the method in accordance with some embodiments of the present disclosure. A substrate 31 including a plurality of fin structures 311 is formed, received, or provided. In some embodiments, a plurality of active regions 34 are formed or implanted using a first photomask including the layout 201. In some embodiments, the plurality of active regions 34 include active regions 341 and 342. In some embodiments, the fin structures 311 are formed after the formation of the active regions 34. In some embodiments, the active regions 34 cover an entirety of the fin structures 311 along a third direction.

Figure 13:
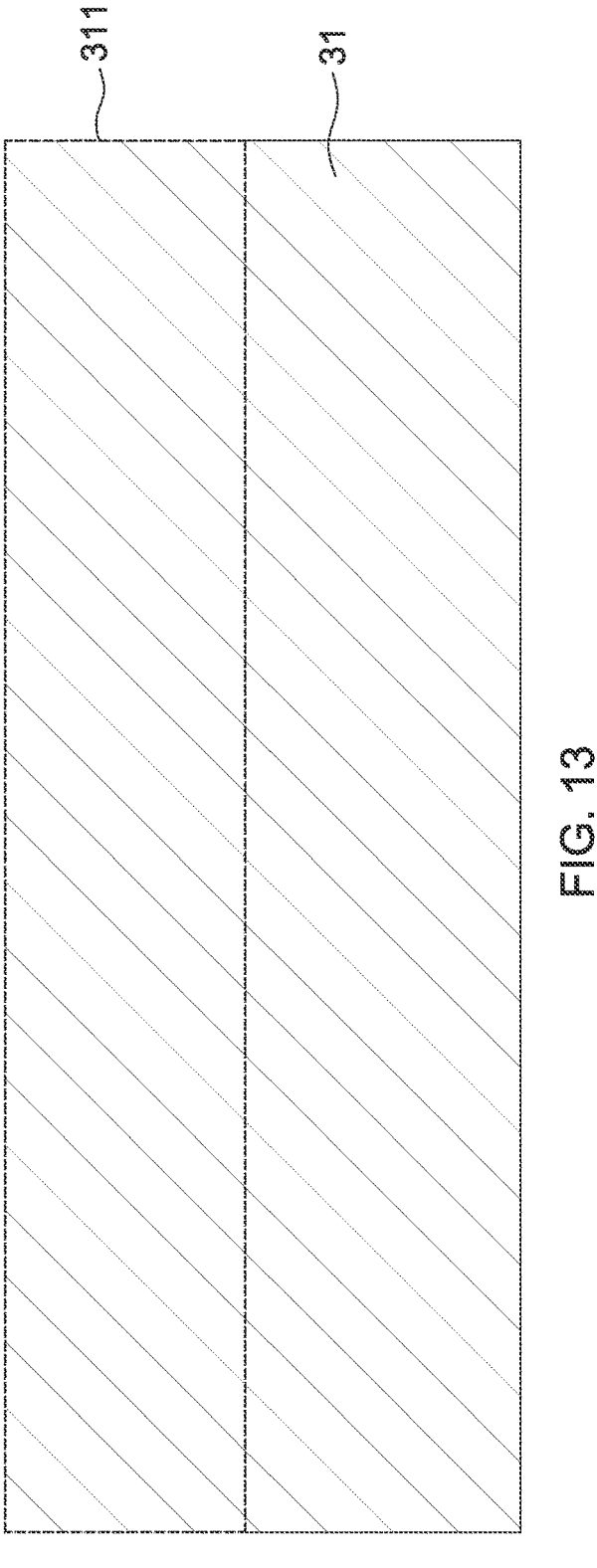
FIGS. 13 and 14 are schematic cross-sectional diagrams of a semiconductor structure at different stages of a manufacturing method in accordance with different embodiments of the disclosure.

Please refer to FIG. 13, which is a schematic cross-sectional diagram of the substrate 31 shown in FIG. 12 along a line C-C' in accordance with some embodiments of the present disclosure. The fin structure 311 is indicated by dashed lines. In some embodiments, the active region of the substrate 31 as seen in the cross section is substantially same as the region enclosed by the dashed lines.

Figure 14:
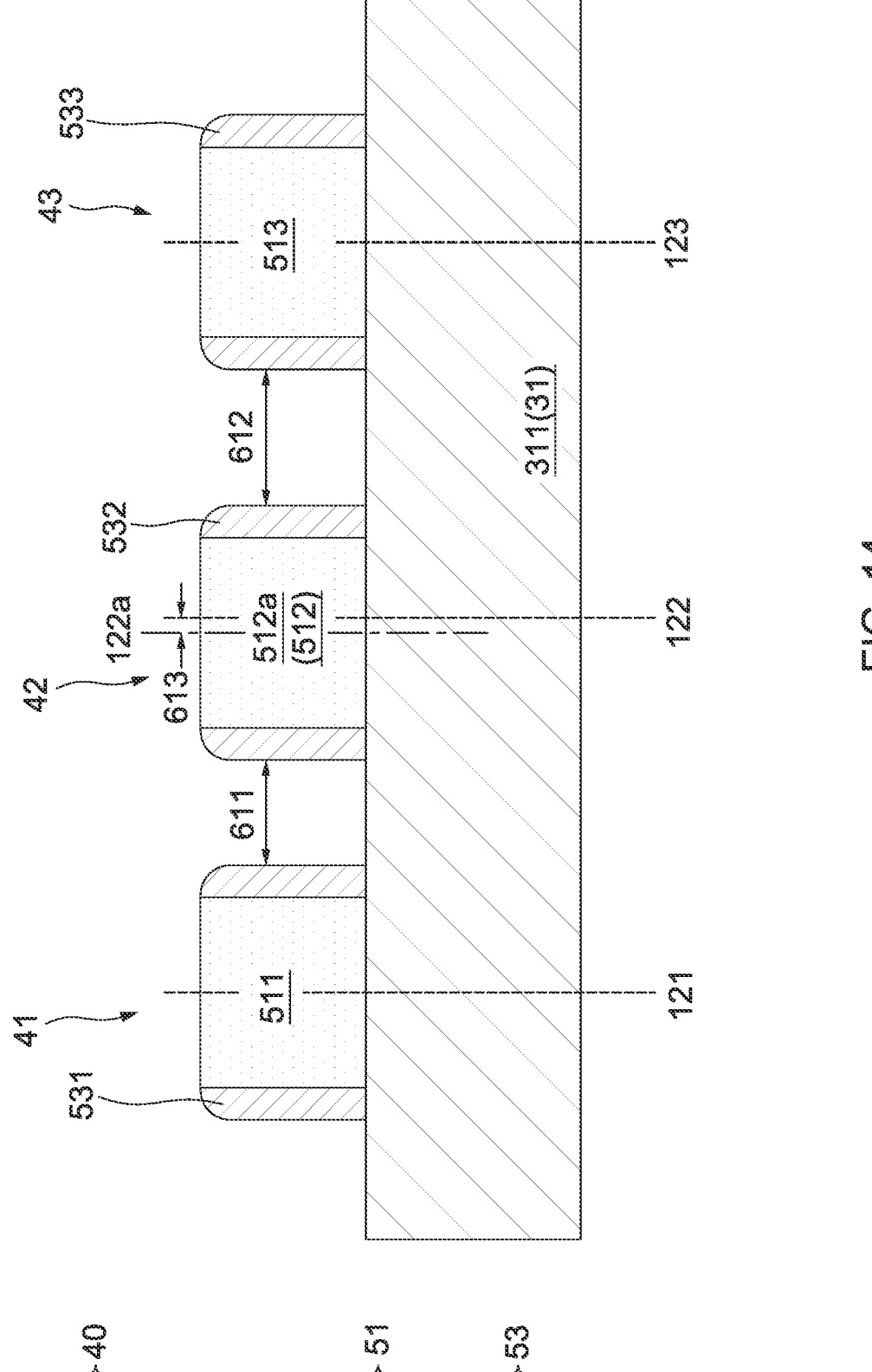

Please refer to FIG. 14, which is a schematic cross-sectional diagram along the line C-C' in FIG. 12 at a stage of the method in accordance with some embodiments of the present disclosure. A plurality of gate structures 40 (including gate structures 41, 42 and 43) are formed over the fin structure 311 and the active region of the substrate 31. In some embodiments, each of the gate structures 41, 42 and 43 includes a gate layer and a sidewall spacer surrounding the gate material layer. For example, the gate structure 41 includes a gate layer 511 and a sidewall spacer 531; the gate structure 42 includes a gate layer 512 and a sidewall spacer 532; and the gate structure 43 includes a gate layer 513 and a sidewall spacer 533. In addition, for a purpose of simplicity, only the fin structure 311 of the substrate is depicted in the following figures.

In some embodiments, the gate layers 511, 512 and 513 are collectively referred to as a gate material layer 51. In some embodiments, the gate material layer 51 includes polysilicon. In some embodiments, the gate material layer 51 is formed by a deposition followed by an extreme ultraviolet (EUV) lithographic operation. In some embodiments, the sidewall spacers 531, 532 and 533 are collectively referred to as a spacer layer 53. In some embodiments, the spacer layer 53 includes oxide, nitride, oxynitride, a suitable high-k material, a suitable low-k material, or a combination thereof. In some embodiments, the spacer layer 53 is formed by a deposition followed by a spacer etching operation. In some embodiments, thicknesses of the sidewall spacers 531, 532 and 533 are substantially equal. In some embodiments, the gate layers 511, 512 and 513 are defined by the layout 205 as described above. Therefore, a distance 611 between the gate structures 41 and 42 shown in FIG. 14 is less than a distance 612 between the gate structures 42 and 43.

Figure 15:
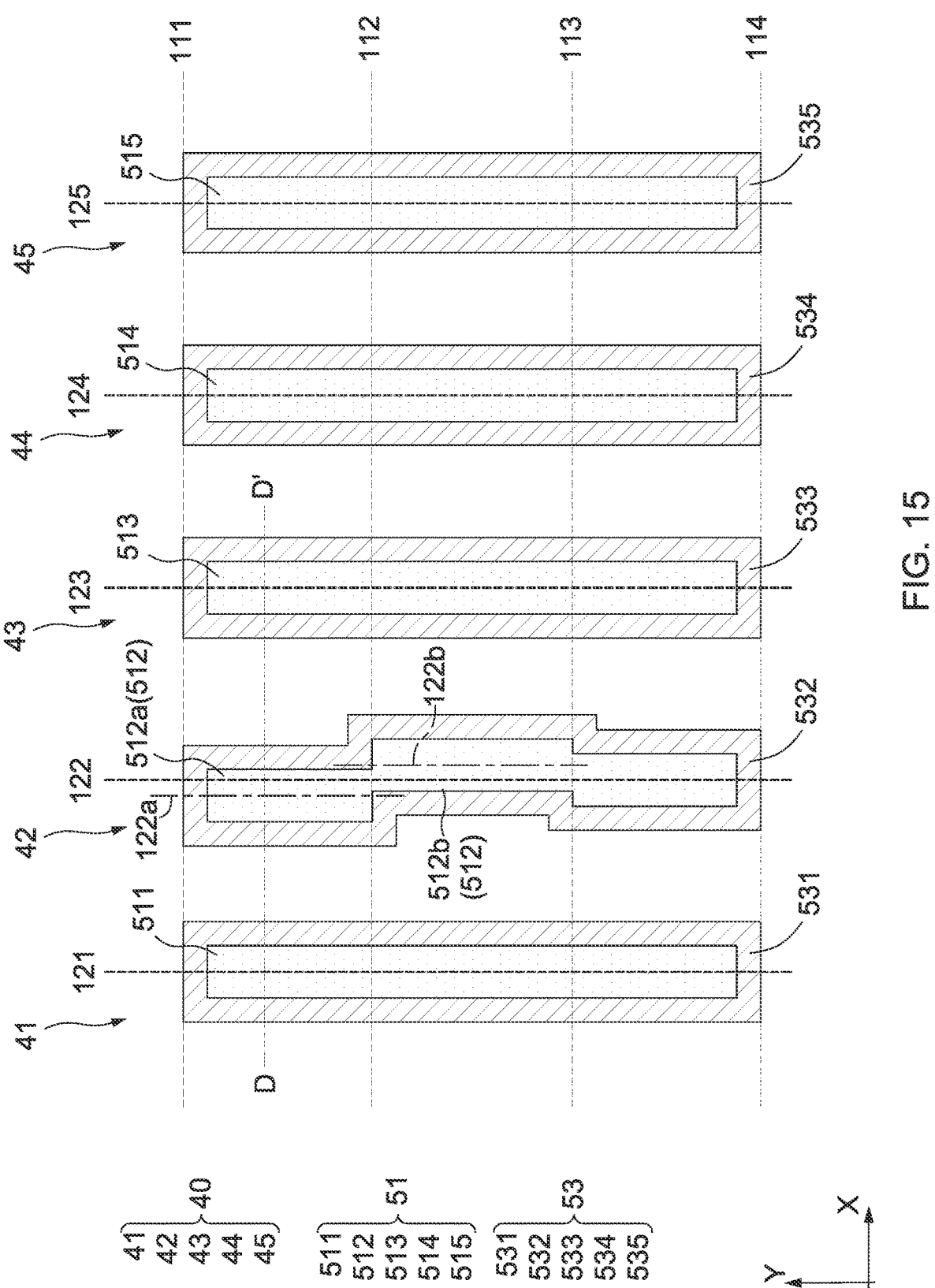
FIG. 15 is a schematic top-view diagram of a semiconductor structure at a stage of the manufacturing method shown in FIG. 14 in accordance with different embodiments of the disclosure.

Please refer to FIG. 15, which is a schematic top-view diagram of the semiconductor structure at a stage of the method in accordance with some embodiments of the present disclosure. The gate material layer 51 can include more than the three gate layers shown in FIG. 14. In some embodiments, the gate material layer 51 includes 5 gate layers (e.g., 511, 512, 513, 514 and 515). It should be noted that a number of gate layers of the gate material layer 51 shown in different figures and/or different embodiments are for a purpose of illustration, and are not intended to limit the present disclosure. Each of the gate layers 511, 512, 513, 514 and 515 may be substantially parallel and extends in the second direction. Different portions of a gate layer 511, 512, 513, 514 or 515 along the second direction may or may not be shifted from a central line of the gate layer 511, 512, 513, 514 or 515 according to the layout 205 and the calculation of capacitances as described above.

As shown in FIGS. 14 and 15, at least one of the gate layers of the gate material layer 51 includes a serrated configuration. In some embodiments, at least one of the gate layers of the gate material layer 51 includes a straight configuration. In some embodiments, the gate layer 512 includes a first portion 512a and a second portion 512b, which are shifted in different directions. In some embodiments, the cross section shown in FIG. 14 is along a line D-D' in FIG. 15. In some embodiments, a distance 613 between a central line 122a of the first portion 512a and a central line 122 of the gate layer 512 is in a range of 1 to 3 nm. In some embodiments, a distance (not labelled in FIG. 15) between a central line 122b of the second portion 512b and a central line 122 of the gate layer 512 is in a range of 1 to 3 nm. In some embodiments, a distance between the central line 122b of the second portion 512b and the central line 122a of the first portion 512a is in a range of 2 to 6 nm. In some embodiments, the sidewall spacer 532 surrounds an entirety of the gate layer 512. In some embodiments, the sidewall spacer 532 encircles the entirety of the gate layer 512. In some embodiments, the spacer layer 53 includes at least one sidewall spacer having a serrated configuration conformal to the serrated gate layer(s).

Figure 17:
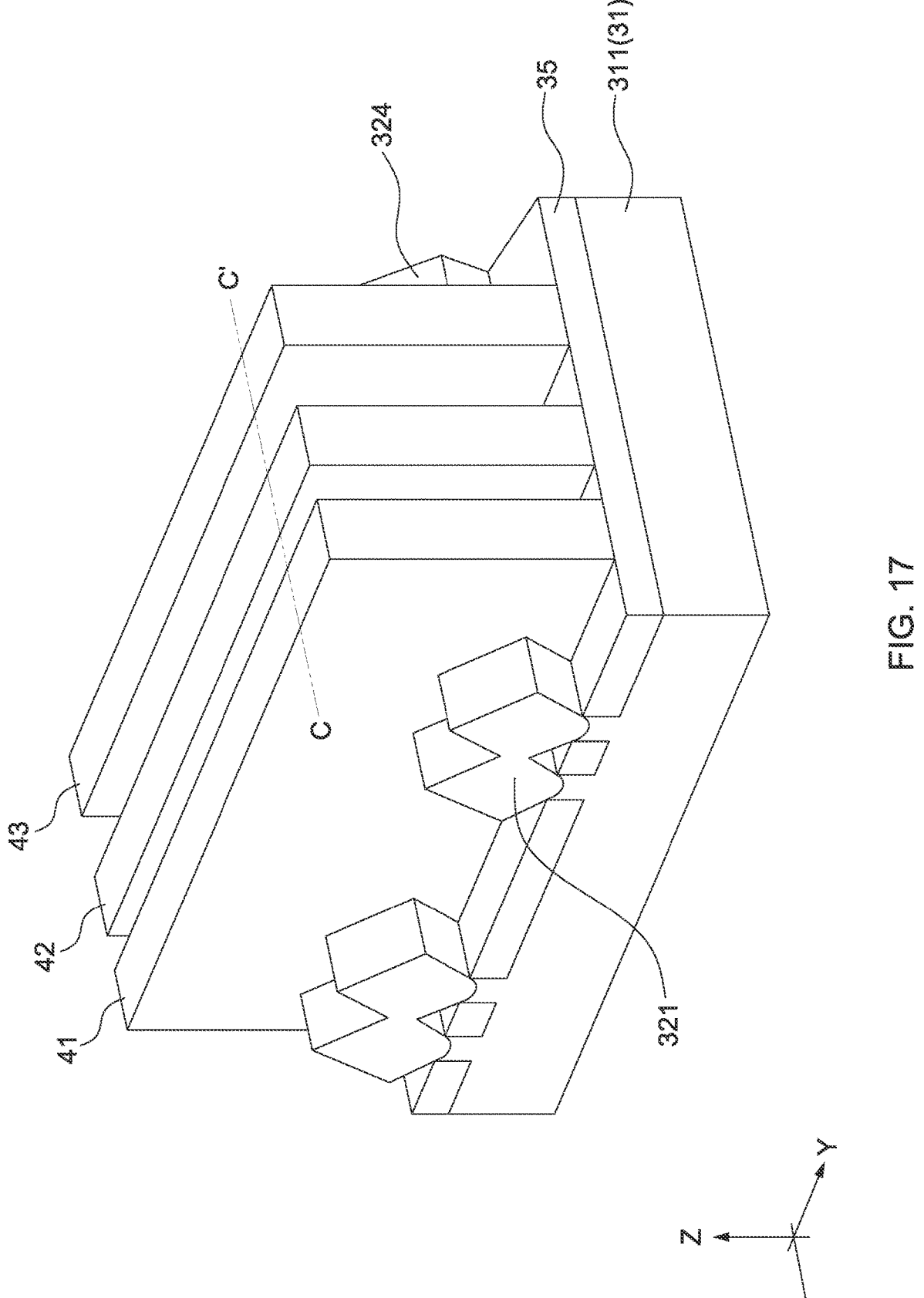
FIG. 17 is a schematic 3D diagram of a semiconductor structure at a stage of the manufacturing method shown in FIG. 16 in accordance with different embodiments of the disclosure.

Please refer to FIG. 17. As shown in FIG. 17, a plurality of source/drain structures 32 are formed in the fin structure 311 and in the active region of the substrate 31. In some embodiments, the source/drain structures 32 are formed by epitaxial growth. In some embodiments, portions of the fin structure 311 are removed prior to the epitaxial growth. In some embodiments, the epitaxial growth is performed after formation of the gate structures 40, and a size or a width of each of the plurality of source/drain structures 32 is defined by adjacent gate structures 40. In some embodiments, the plurality of source/drain structures 32 include source/drain structures 321, 322, 323 and 324, wherein some of the source/drain structures 321, 322, 323 and 324 have substantially equal widths, and some of the source/drain structures 321, 322, 323 and 324 have different widths along the first direction.

As shown in FIG. 16, the source/drain structures 322 and 323 have different sizes and/or different widths along the first direction according to the distances 611 and 612. In some embodiments, a width 622 of the source/drain structure 322 is less than a width 623 of the source/drain structure 323 since the distance 611 is less than the distance 612. In some embodiments, as illustrated in FIG. 9 and described above in related paragraphs, the gate structure 42 is closer to a source of a transistor due to the Miller effect; thus the source/drain structure 322 is a source and the source/drain structure 323 is a drain of the transistor. In some embodiments, a width 624 of the source/drain structure 324 is defined by the gate structures 43 and 44 shown in FIGS. 15 and 16. In some embodiments, the width 624 is less than the width 623 and greater than the width 622. In some embodiments, the width 624 is substantially equal to a width 621 of the source/drain structure 321.

Please refer to FIG. 17, which is a schematic 3D diagram of the semiconductor structure at a stage shown in FIG. 16. Each of the gate structures 40 (including the gate structures 41, 42 and 43) may cover different fin structures 311. In some embodiments, an isolating layer 35 is formed prior to the formation of the gate structures 40. In some embodiments, the gate structures 40 and the source/drain structures 32 are formed over the isolating layer 35. A conventional method can be applied, and is not limited herein.

Figure 18:
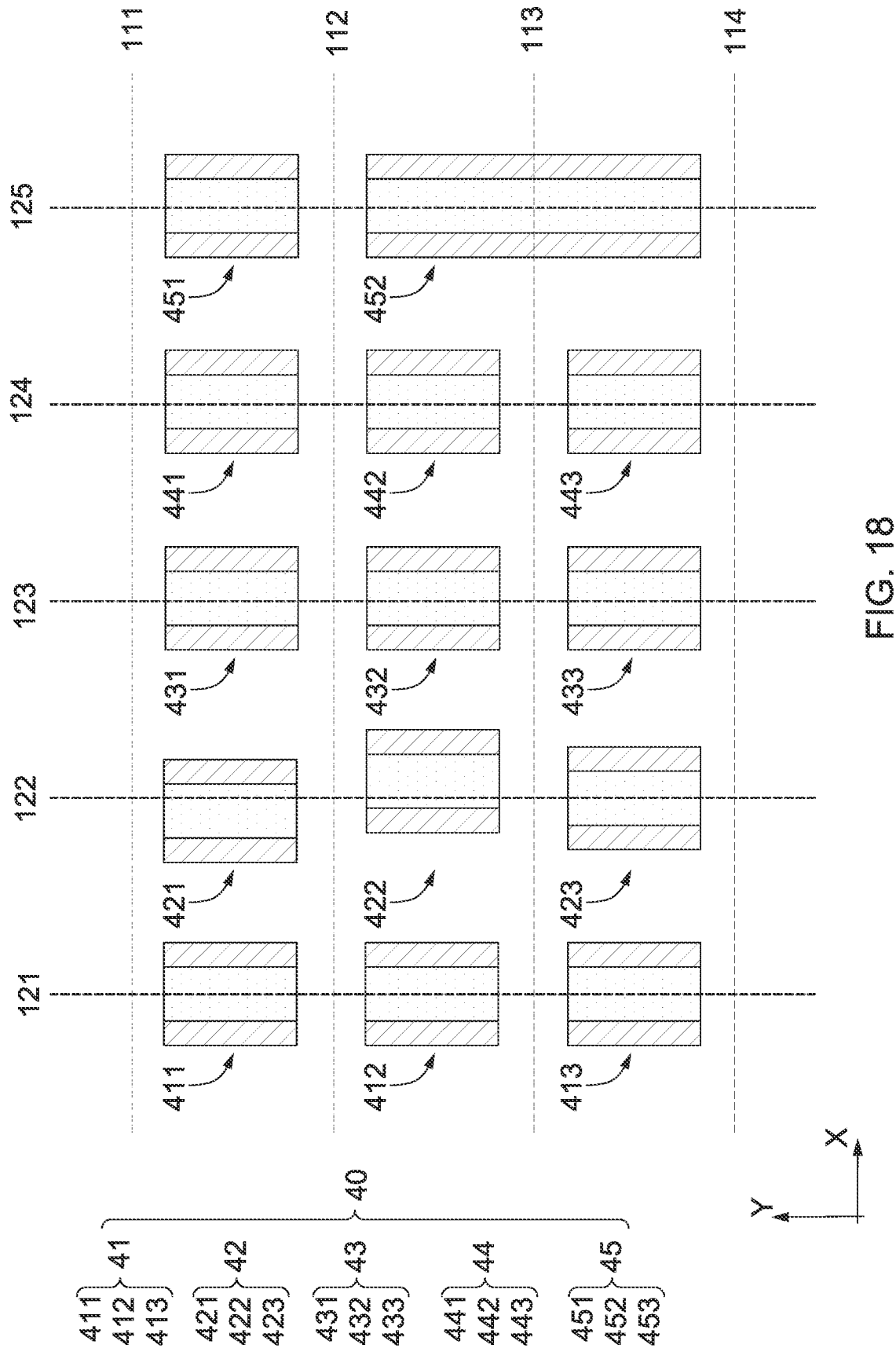
FIG. 18 is a schematic top-view diagram of a semiconductor structure at a stage of a manufacturing method in accordance with different embodiments of the disclosure.

Please refer to FIG. 18, which is a schematic top-view perspective of the semiconductor structure at a stage of the manufacturing method in accordance with some embodiments of the present disclosure. In some embodiments, a cut-gate operation is performed to remove portions of the gate structures 40 (e.g., along lines 111, 112, 113, 114 and 115) to provide a plurality of gate structures along the first direction and a plurality of gate structures along the second direction. In some embodiments, the gate structure 41 is divided into gate structures 411, 412 and 413. In some embodiments, the gate structure 42 is divided into gate structures 421, 422 and 423. In some embodiments, the gate structure 43 is divided into gate structures 431, 432 and 433. In some embodiments, the gate structure 44 is divided into gate structures 441, 442 and 443. In some embodiments, the gate structure 45 is divided into gate structures 451 and 452. It should be noted that a number of gate structures that each of the gate structures 40 is divided into can be different according to different embodiments. In some embodiments, at least one of the gate structures (e.g., the gate structure 452) extends along the second direction across adjacent cell rows for a purpose of electrical connection between two gate electrodes of adjacent transistors.

Figure 19:
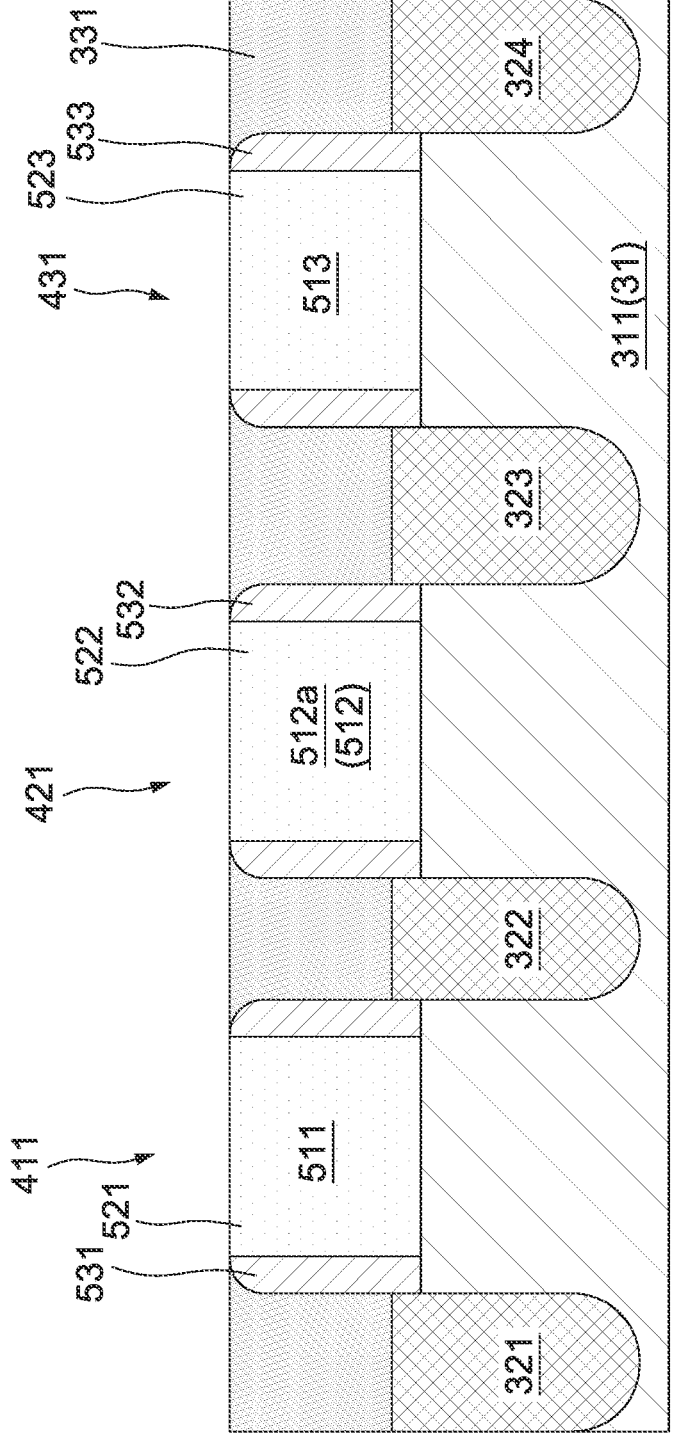

Please refer to FIG. 19, which is a schematic cross-sectional diagram of the semiconductor structure at a stage of the manufacturing method in accordance with some embodiments of the present disclosure. A dielectric layer 331 is formed over the substrate 31. In some embodiments, the dielectric layer 331 covers the fin structure 311 and the source/drain structures 32. In some embodiments, the dielectric layer 331 surrounds each of the gate structures 40. The dielectric layer 331 can be formed by a deposition followed by an etch-back operation until one or more of the gate structures 40 are exposed.

Figure 20:
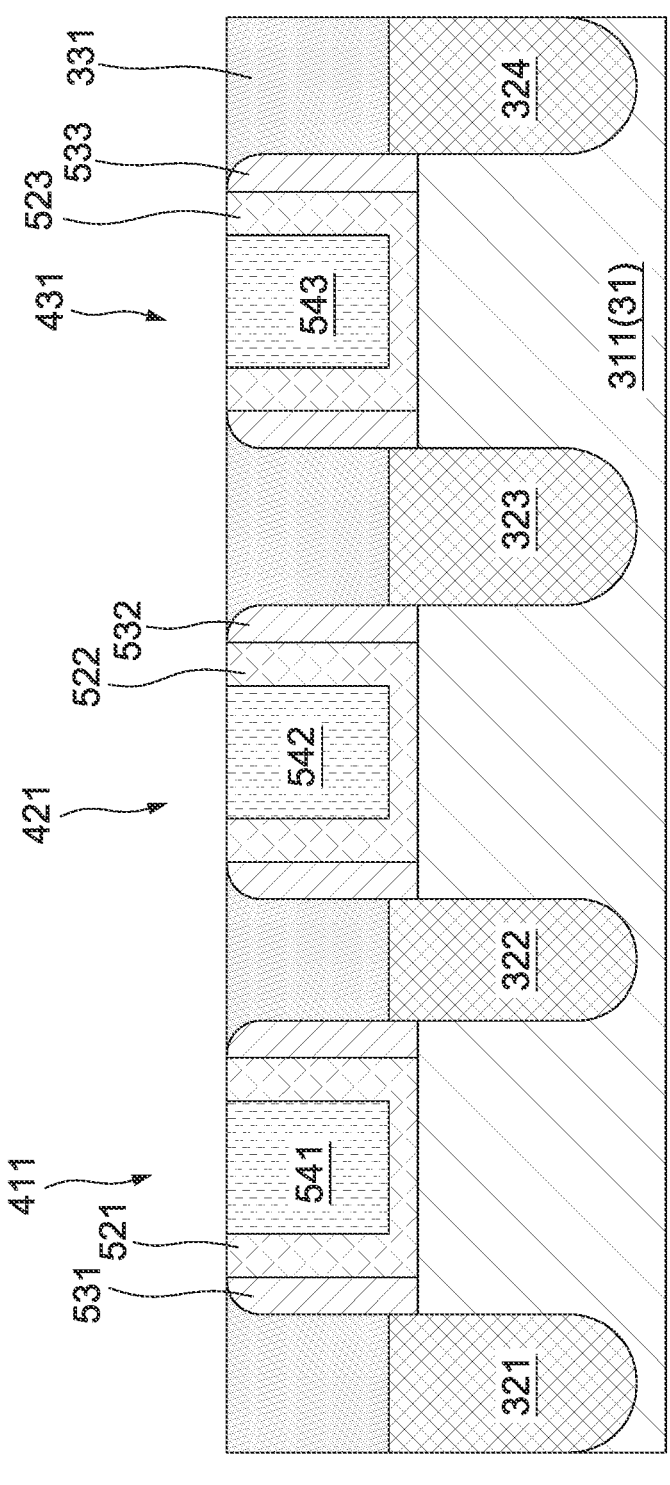
Figure 20:
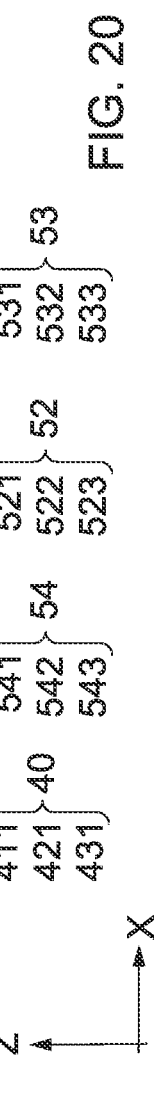

Please refer to FIG. 20, which is a schematic cross-sectional diagram of the semiconductor structure at a stage of the manufacturing method in accordance with some embodiments of the present disclosure. A gate replacement is performed on the gate structures 40. In some embodiments, the gate material layer 40 is a sacrificial layer, and is removed and replaced by a metallic material. In some embodiments, after the removal of the gate material layer 40, a plurality of work function layers 52 are formed. In some embodiments, the plurality of work function layers 52 include work function layers 521, 522 and 523. In some embodiments, the work function layer 521 is conformal to the sidewall spacer 531 and the fin structure 311. In some embodiments, the work function layer 522 is conformal to the sidewall spacer 532 and the fin structure 311. In some embodiments, the work function layer 523 is conformal to the sidewall spacer 533 and the fin structure 311.

A plurality of gate layers 54 are then formed and fill spaces of the removed gate material layer 40. In some embodiments, the plurality of gate layers 54 include gate layers 541, 542 and 543. In some embodiments, the gate layer 541 is surrounded by the work function layer 521. In some embodiments, the gate layer 542 is surrounded by the work function layer 522. In some embodiments, the gate layer 543 is surrounded by the work function layer 523. In some embodiments, a deposition of a metal-containing layer and a deposition of the metallic material layer are sequentially performed, and an etching operation is performed on the metal-containing layer and the metallic material layer until the dielectric layer 331 is exposed to form the work function layers 52 and the gate layers 54 respectively from the metal-containing layer and the metallic material layer.

It should be noted that the cut-gate operation can be performed after the gate-replacement operation. In alternative embodiments, the dielectric layer 331 is formed directly after the formation of the source/drain structures 32, and the cut-gate operation as depicted in FIG. 18 is performed after the gate-replacement operation. In alternative embodiments, the cut-gate operation is referred to as a cut-metal-gate operation. In some embodiments, the cut-gate operation is performed on the polysilicon material of the gate material layer 51, and the cut-gate operation is referred to as a cut-poly operation.

Figure 21:
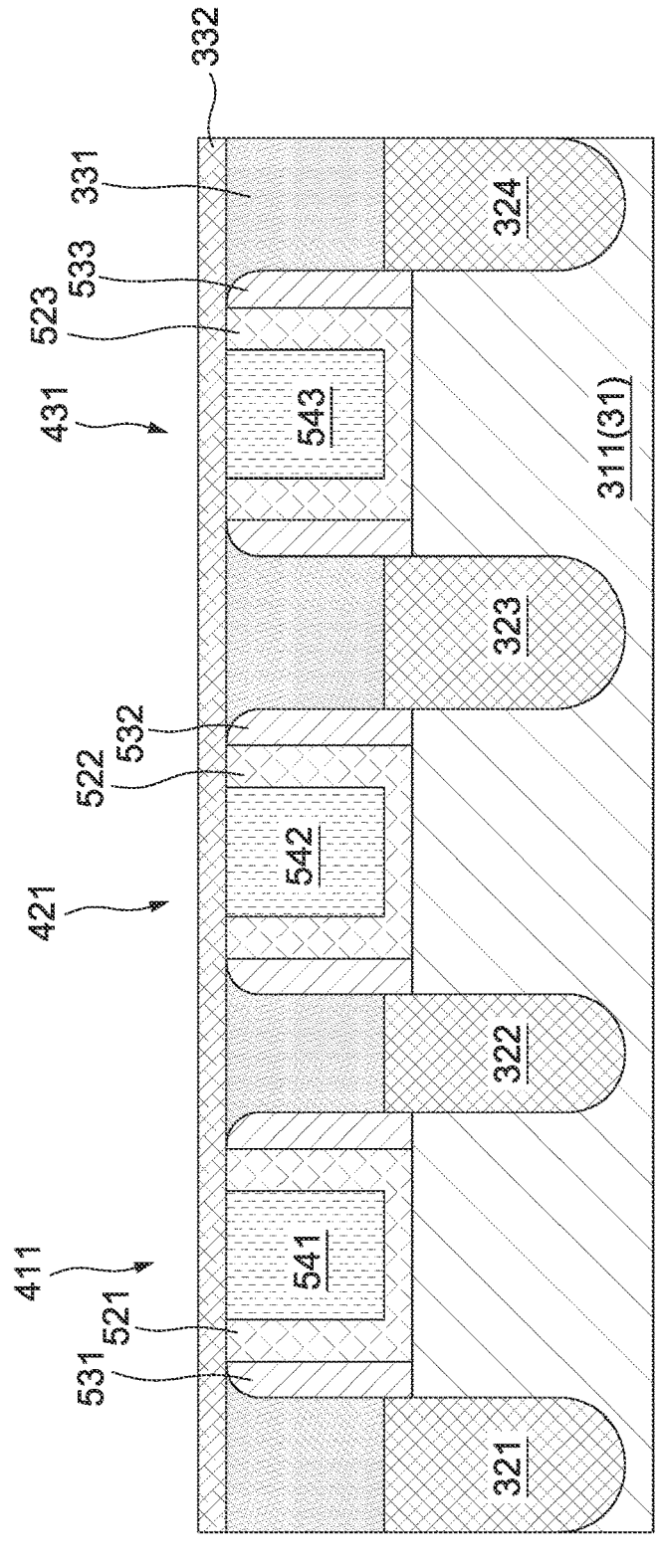

Please refer to FIG. 21, which is a schematic cross-sectional diagram of the semiconductor structure at a stage of the manufacturing method in accordance with some embodiments of the present disclosure. An etch stop layer 332 is formed over the dielectric layer 331 and the gate structures 40 after the gate replacement. In some embodiments, the etch stop layer 332 covers an entirety of the gate structures 40. In some embodiments, the etch stop layer 332 covers an entirety of the dielectric layer 331. In some embodiments, the etch stop layer 332 is formed by a deposition.

Figure 23:
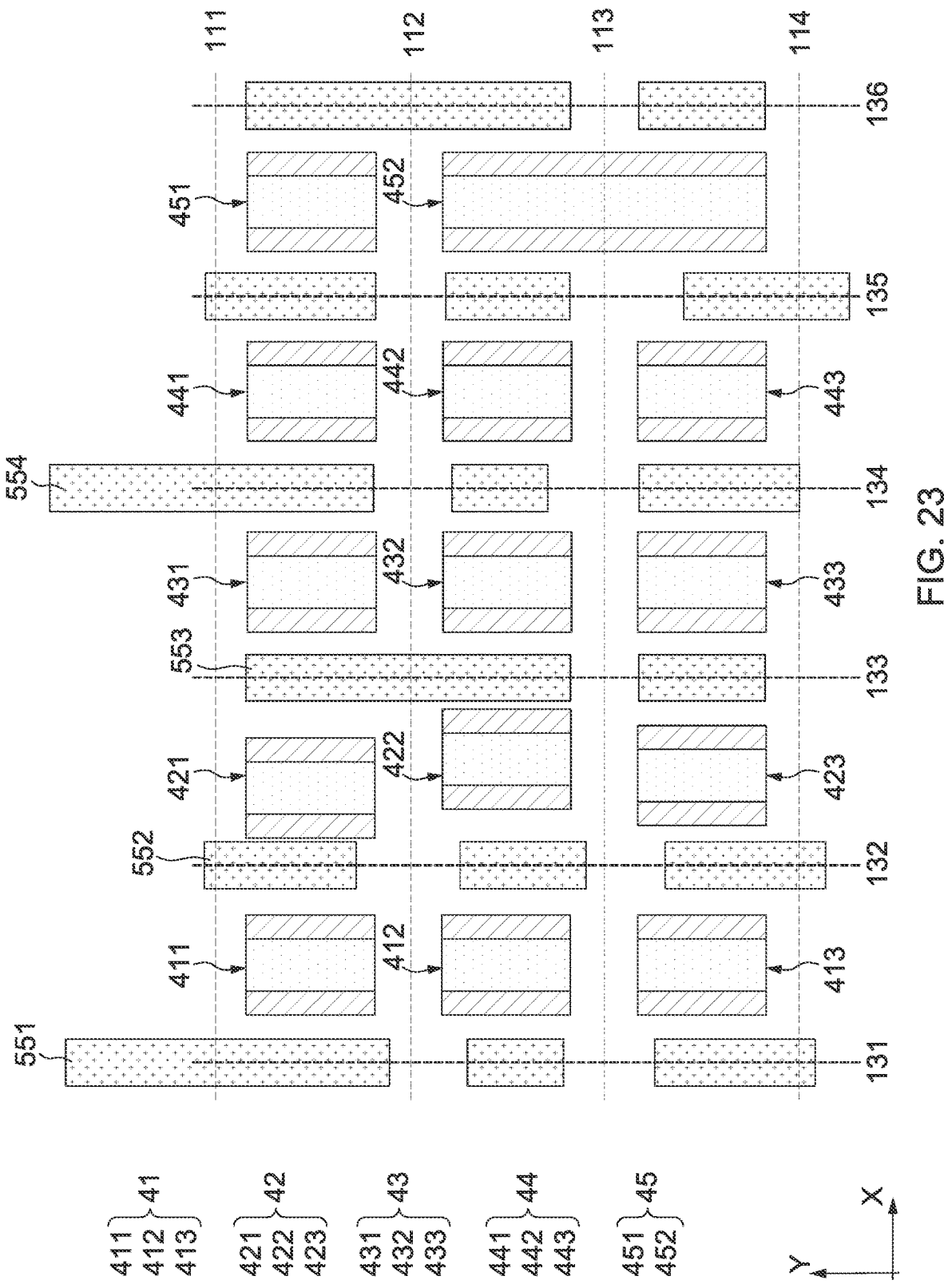
FIG. 23 is a schematic top-view diagram of a semiconductor structure at a stage of the manufacturing method shown in FIG. 22 in accordance with different embodiments of the disclosure.

Please refer to FIGS. 22 and 23, in which FIG. 22 is a schematic cross-sectional diagram and FIG. 23 is a schematic top view of the semiconductor structure at a stage of the manufacturing method in accordance with some embodiments of the present disclosure. A plurality of contact structures 55 are formed. In some embodiments, each of the contact structures 55 penetrates the etch stop layer 332 and the dielectric layer 331. In some embodiments, the plurality of contact structures 55 include a contact structure 551 disposed adjacent to the gate structure 411 and electrically connected to the source/drain structure 321. In some embodiments, the plurality of contact structures 55 include a contact structure 552 disposed between the gate structures 411 and 421 and electrically connected to the source/drain structure 322. In some embodiments, the plurality of contact structures 55 include a contact structure 553 disposed between the gate structures 421 and 431 and electrically connected to the source/drain structure 323. In some embodiments, the plurality of contact structures 55 include a contact structure 554 disposed between the gate structures 431 and 441 and electrically connected to the source/drain structure 324.

In some embodiments, contact structures 55 arranged along the second direction are aligned as shown in FIG. 23, wherein central lines (e.g., 131, 132, 133, 134, 135 and 136) of the contact structures 55 along the second direction are shown as dashed lines for a purpose of illustration. In some embodiments, distances between adjacent contact structures 55 arranged along the first direction are substantially equal, as shown in FIGS. 22 and 23. Therefore, distances between a contact structure 55 and two adjacent gate structures 40 can be substantially equal or different depending on whether the adjacent gate structure 40 is shifted or not. In addition, distances between a gate structure 40 and two adjacent contact structures 55 can be substantially equal or different depending on whether the gate structure 40 is shifted or not.

For example, the gate structure 411 is not shifted, and a distance 631 between the gate structure 411 and the contact structure 551 and a distance 632 between the gate structure 411 and the contact structure 552 are substantially equal. In some embodiments, the gate structure 421 is shifted, and a distance 633 between the gate structure 421 and the contact structure 552 and a distance 634 between the gate structure 421 and the contact structure 553 are different. In some embodiments, the distance 633 is less than the distance 634 by 2 to 6 nm. In some embodiments, the distance 633 is less than the distance 631 or 632 by 1 to 3 nm. In some embodiments, the distance 634 is greater than the distance 631 or 632 by 1 to 3 nm. The semiconductor structure 100 is thereby formed.

The present disclosure provides a manufacturing method of a semiconductor structure and the structure thereof. The semiconductor structure includes at least a shifted gate structure, wherein distances between the shifted gate structure and adjacent contact structures are different. Capacitances generated between source/drain contacts and a gate structure of a transistor can affect a total capacitance of the transistor. It is found that the capacitance $C_{gd}$ has a greater influence on a total capacitance of the transistor compared to the capacitance $C_{gs}$ due to a Miller effect. In order to achieve a lower total capacitance of a semiconductor structure, calculations of the capacitance $C_{gd}$ and the capacitance $C_{gs}$ are performed to obtain a distance of offset of a gate structure toward a source structure of the transistor. There-fore, at least one gate pattern is shifted prior to formation of a photomask including patterns of gate structures, and a corresponding gate structure offset from other gate structures on a same column is thereby formed. A capacitance of the semiconductor structure can thereby be improved.

Figure 24:
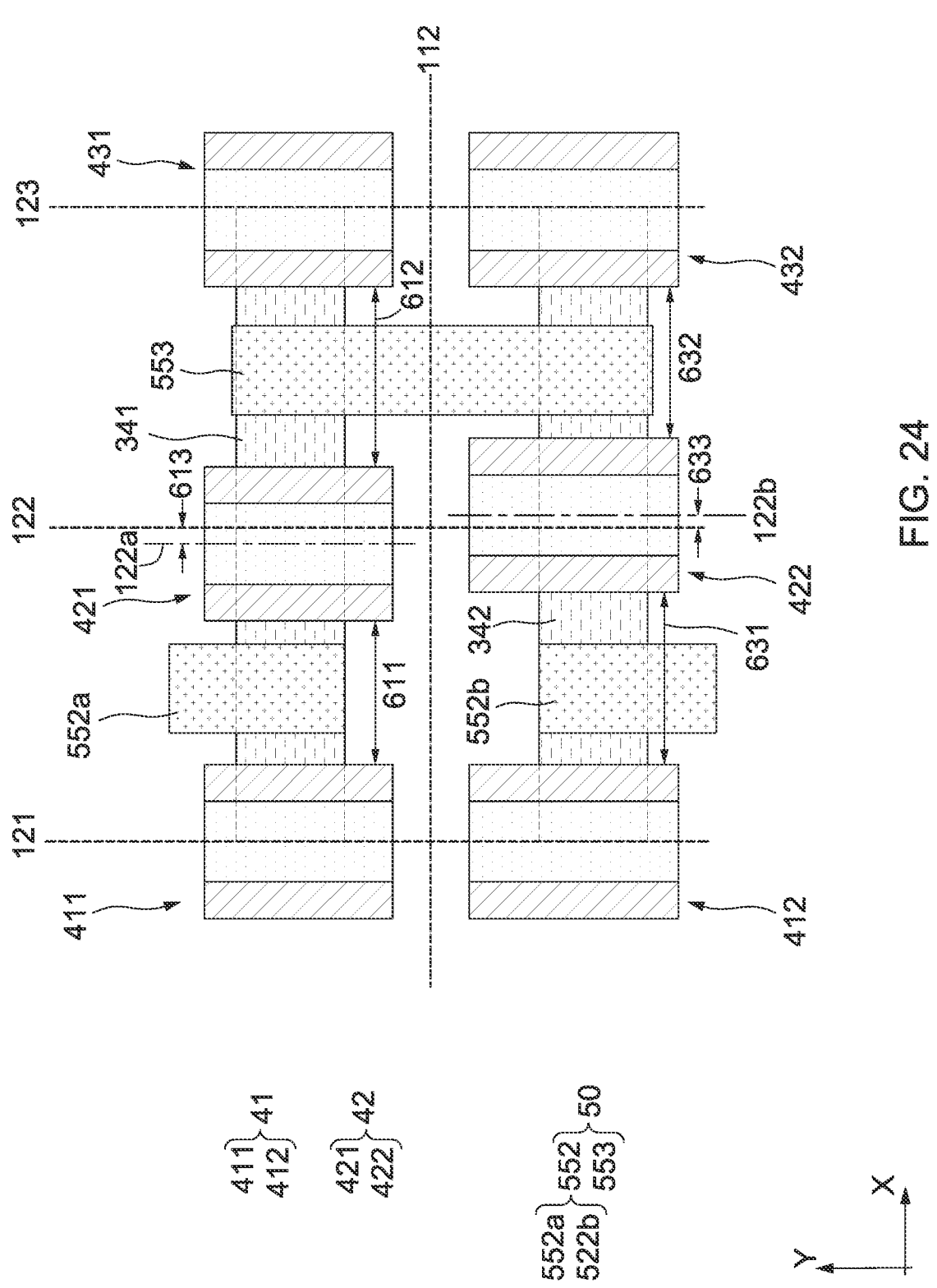
FIG. 24 is an enlarged schematic top-view diagram of a portion B of the semiconductor structure in FIG. 1 in accordance with some embodiments of the disclosure.

FIG. 24 is an enlarged schematic top view of the region B of the semiconductor structure 100 shown in FIG. 1 in accordance with some embodiments of the present disclosure. The gate structures in a same column may be disposed over boundaries of different active regions arranged along the second direction. In some embodiments, the gate structures 411 and 431 are disposed over two opposite boundaries of the active region 341. In some embodiments, the gate structures 412 and 432 are disposed over two opposite boundaries of the active region 342. The gate structures disposed over the boundaries of the active regions can be used as references of related positions and distances to other transistors in other active regions during a manufacturing process. Therefore, positions and arrangements of such gate structures remain the same regardless of the calculated capacitances. In some embodiments, the calculation is not performed on such gate structures. In other words, the gate structures being shifted are all disposed within an active region along the first direction. The manufacturing method of the present disclosure as described above can be integrated with a conventional method, and a capacitance of the semiconductor structure 100 can be minimized.

Figure 25:
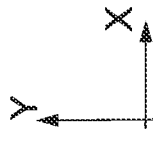
FIG. 25 is a schematic diagram of a layout including gate patterns in accordance with different embodiments of the disclosure.

FIG. 25 is a schematic top view of gate patterns 51' of the layout 205 in accordance with some embodiments of the present disclosure. As described above, at least one of the gate patterns 51' is shifted according to the calculation, and an arrangement of the gate patterns 51' is not limited herein. FIG. 25 shows an exemplary embodiment of the present disclosure. Adjacent gate patterns along the second direction can be shifted in opposite directions or in a same direction. A shifting distance of the shifted gate patterns can be different according to the calculation.

To conclude the operations as illustrated in FIGS. 12 to 23 above, a method 700 and a method 800 within a same concept of the present disclosure are provided.

FIG. 26 is a flow diagram of a method 700 for manufacturing a semiconductor structure in accordance with some embodiments of the present disclosure. The method 700 includes a number of operations (701, 702, 703, 704, 705 and 706) and the description and illustration are not deemed as a limitation to the sequence of the operations. In the operation 701, a first layout is received, wherein the first layout comprises at least a pattern of an active region extending in a first direction. In the operation 702, a second layout comprising a plurality of gate patterns extending in a second direction substantially perpendicular to the first direction is received, wherein distances between adjacent gate patterns are substantially consistent among the plurality of gate patterns. In the operation 703, the first layout and the second layout are overlapping, thereby forming a plurality of transistor patterns. In the operation 704, one of the plurality of gate patterns is shifted toward a source of one of the transistor patterns to form a third layout. In the operation 705, a first photomask including the third layout is formed. In the operation 706, the third layout of the photomask is transferred to form a plurality of gate structures over a substrate.

FIG. 27 is a flow diagram of a method 800 for manufacturing a semiconductor structure in accordance with some embodiments of the present disclosure. The method 800 includes a number of operations (801, 802, and 803) and the description and illustration are not deemed as a limitation to the sequence of the operations. In the operation 801, a gate structure is formed over an active region in a substrate. In the operation 802, a source structure and a drain structure are formed at two opposite sides of the gate structure. In the operation 803, a first contact and a second contact electrically connected to the source structure and the drain structure respectively are formed, wherein a first distance between the gate structure and the first contact is different from a second distance between the gate structure and the second contact.

It should be noted that the operations of the method 700 and/or the method 800 may be rearranged or otherwise modified within the scope of the various aspects. Additional processes may be provided before, during, and after the method 700 and/or the method 800, and some other processes may be only briefly described herein. Thus, other implementations are possible within the scope of the various aspects described herein.

In accordance with some embodiments of the disclosure, a method for manufacturing a semiconductor structure is provided. The method includes a number of operations. A first layout is received, wherein the first layout comprises at least a pattern of an active region extending in a first direction. A second layout comprising a plurality of gate patterns extending in a second direction substantially perpendicular to the first direction is received, wherein distances between adjacent gate patterns are substantially consistent among the plurality of gate patterns. The first layout and the second layout are overlapping, thereby forming a plurality of transistor patterns. One of the plurality of gate patterns is shifted toward a source of one of the transistor patterns to form a third layout. A first photomask including the third layout is formed. The third layout of the photomask is transferred to form a plurality of gate structures over a substrate.

In accordance with some embodiments of the disclosure, a method for manufacturing a semiconductor structure is provided. The method includes a number of operations. A gate structure is formed over an active region in a substrate. A source structure and a drain structure are formed at two opposite sides of the gate structure. A first contact and a second contact electrically connected to the source structure and the drain structure respectively are formed, wherein a first distance between the gate structure and the first contact is different from a second distance between the gate structure and the second contact.

In accordance with some embodiments of the disclosure, a semiconductor structure is provided. The semiconductor structure includes a gate structure, disposed over a fin structure of a substrate; a source structure and a drain structure, disposed at two opposite sides of the gate structure; and a first contact and a second contact, electrically connected to the source structure and the drain structure respectively, wherein a first distance between the gate structure and the first contact is different from a second distance between the gate structure and the second contact.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:

receiving a first layout, comprising at least a pattern of an active region extending along a first direction;

receiving a second layout comprising a plurality of gate patterns extending along a second direction substantially perpendicular to the first direction, wherein distances between adjacent gate patterns are substantially consistent among the plurality of gate patterns;

overlapping the first layout and the second layout, thereby forming a plurality of transistor patterns;

shifting one of the plurality of gate patterns toward a source of one of the transistor patterns to form a third layout;

forming a first photomask including the third layout, wherein the first photomask includes the plurality of gate patterns, each gate pattern includes a first gate pattern, a second gate pattern, and a third gate pattern disposed between the first gate pattern and the second gate pattern, and the one of the plurality of gate pattern being shifted is the third gate pattern, and a distance between the third gate pattern and the first gate pattern is greater than or less than a distance between the third gate pattern and second gate pattern by a distance in a range of 2 to 6 nanometers; and transferring the third layout of the photomask to form a plurality of gate structures over a substrate.

2. The method of claim 1, wherein the one of the plurality of gate patterns is shifted by a distance in a range of 1 to 3 nanometers.

3. The method of claim 1, further comprising:

receiving a fourth layout, including a plurality of contact patterns;

overlapping the fourth layout and the third layout, wherein the plurality of contact patterns and the plurality of gate patterns are alternately arranged;

forming a second photomask including the fourth layout; and transferring the fourth layout of the second photomask to form a plurality of contact structures over the substrate.

4. The method of claim 3, wherein distances between the one of the plurality of gate patterns and two adjacent contact patterns are different during the overlapping of the fourth layout and the third layout.

5. A method for manufacturing a semiconductor structure, comprising:

forming a gate structure over an active region in a substrate, wherein the gate structure comprises a first portion and a second portion coupled to the first portion, and a distance between a central line of the first portion and a central line of the second portion is greater than 0;

forming a source structure and a drain structure at two opposite sides of the first portion of the gate structure; and forming a first contact and a second contact electrically connected to the source structure and the drain structure, respectively, wherein a first distance between the first portion of the gate structure and the first contact is different from a second distance between the first portion of the gate structure and the second contact, wherein the forming of the first contact and the second contact further comprises:

forming a dielectric layer over the substrate;

forming an etch stop layer over the dielectric layer and the gate structure; and forming the first contact and the second contact in the dielectric layer, wherein the first contact and the second contact penetrate the etch stop layer.

6. The method of claim 5, wherein a first width of the source structure is substantially less than a second width of the drain structure.

7. The method of claim 6, wherein the first width is less than the second width by 2 to 6 nanometers.

8. The method of claim 5, wherein the first distance is substantially less than the second distance.

9. The method of claim 5, wherein the first contact, the second contact and the gate structure are substantially parallel.

10. The method of claim 9, wherein the first contact, the second contact and the gate structure extend in a direction substantially perpendicular to an extending direction of the active region.

11. The method of claim 5, wherein a third distance between the gate structure and a first boundary of the active region of the substrate is different from a fourth distance between the gate structure and a second boundary of the active region opposite to the first boundary along an extending direction of the active region.

12. The method of claim 5, wherein the gate structure is a sacrificial gate structure, and the method further comprises:

removing a polysilicon material of the sacrificial gate structure; and depositing a metallic material to form a metal gate structure.

13. The method of claim 12, wherein the polysilicon material of the sacrificial gate structure is patterned by extreme ultraviolet (EUV) lithography.

14. The method of claim 5, wherein the source structure and the drain structure are formed concurrently by an epitaxial growth.

15. The method of claim 5, wherein the active region comprises at least a fin structure.

16. A method of manufacturing a semiconductor structure, comprising:

receiving a first layout, comprising at least a pattern of an active region extending along a first direction;

receiving a second layout comprising a plurality of gate patterns extending along a second direction substantially perpendicular to the first direction, wherein distances between adjacent gate patterns are substantially consistent among the plurality of gate patterns;

overlapping the first layout and the second layout, thereby forming a plurality of transistor patterns;

shifting one of the plurality of gate patterns toward a source of one of the transistor patterns to form a third layout;

forming a first photomask including the third layout;

transferring the third layout of the photomask to form a plurality of gate structures over a substrate;

receiving a fourth layout, including a plurality of contact patterns;

overlapping the fourth layout and the third layout, wherein the plurality of contact patterns and the plurality of gate patterns are alternately arranged;

forming a second photomask including the fourth layout; and transferring the fourth layout of the second photomask to form a plurality of contact structures over the substrate, wherein distances between the one of the plurality of gate patterns and two adjacent contact patterns are different during the overlapping of the fourth layout and the third layout.

17. The method of claim 16, wherein the one of the plurality of gate patterns is shifted by a distance in a range of 1 to 3 nanometers.

18. The method of claim 5, further comprising forming a sidewall spacer over sidewalls of the gate structure.

19. The method of claim 18, wherein the sidewall spacer is formed prior to the formation of the source structure and the drain structure.

20. The method of claim 18, wherein the sidewall spacer comprises dielectric materials.

* * * * *